US007685543B2

(12) United States Patent
Tsuji et al.

(10) Patent No.: US 7,685,543 B2
(45) Date of Patent: Mar. 23, 2010

(54) SIMULATION APPARATUS AND SIMULATION METHOD USED TO DESIGN CHARACTERISTICS AND CIRCUITS OF SEMICONDUCTOR DEVICE, AND SEMICONDUCTOR DEVICE FABRICATION METHOD

(75) Inventors: Hiroshi Tsuji, Mino (JP); Yoshiteru Shimizu, Hitachinaka (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 424 days.

(21) Appl. No.: 11/776,730

(22) Filed: Jul. 12, 2007

(65) Prior Publication Data
US 2008/0028342 A1 Jan. 31, 2008

(30) Foreign Application Priority Data
Jul. 25, 2006 (JP) ............................. 2006-202195

(51) Int. Cl.
*G06F 17/50* (2006.01)
(52) U.S. Cl. ..................... 716/4; 716/5; 703/13; 703/14
(58) Field of Classification Search ...................... 716/2, 716/4–5; 703/13–14
See application file for complete search history.

(56) References Cited
U.S. PATENT DOCUMENTS
2008/0244477 A1* 10/2008 Miura et al. ................... 716/4

OTHER PUBLICATIONS
Xuemei (Jane) Xi, et al., "BSIM4.3.0 MOSFET Model, User's Manual," Department of Electrical Engineering and Computer Sciences, Univsity of California, 2003, 6 pages.
Mitiko Miura-Mattausch, et al., "Unified Complete Mosfet Model for Analysis of Digital and Analog Circuits," IEEE Transactions on Computer-Aided Design of Integrated Circuits and Systems, vol. 15, No. 1, Jan. 1996, pp. 1-7.
M. Shur, et al., "Physics of amorphous silicon based alloy field-effect tranistors," J. Appl. Phys. 55 (10), May 15, 1984, pp. 3831-3842.

* cited by examiner

*Primary Examiner*—Paul Dinh
(74) *Attorney, Agent, or Firm*—Oblon, Spivak, McClelland, Maier & Neustadt, L.L.P.

(57) ABSTRACT

Disclosed is a simulation apparatus including an input unit, storage unit, arithmetic unit, controller, and output unit. The input unit inputs a first potential at the source end, which corresponds to the gate end of a TFT, on that surface of a thin polysilicon film which faces the gate, a second potential at the source end on the back surface of the thin polysilicon film on which the gate is formed, a third potential at the drain end, which corresponds to the gate end of the TFT, on that surface of the thin polysilicon film which faces the gate, and a fourth potential at the drain end on the back surface of the thin polysilicon film. A drain current is calculated by performing an arithmetic operation on the basis of the first to fourth potentials, and a model is formed by including defect states.

15 Claims, 15 Drawing Sheets

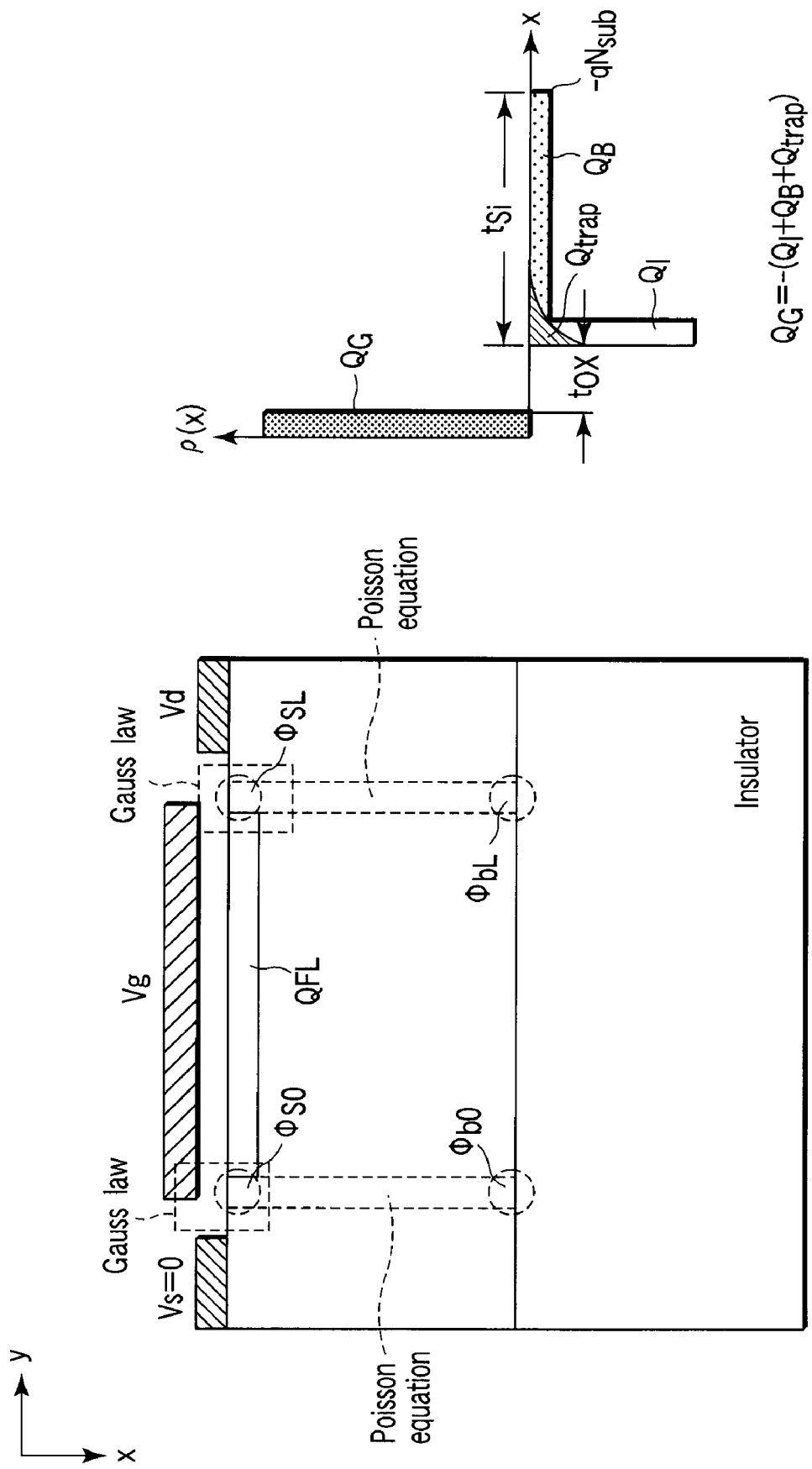

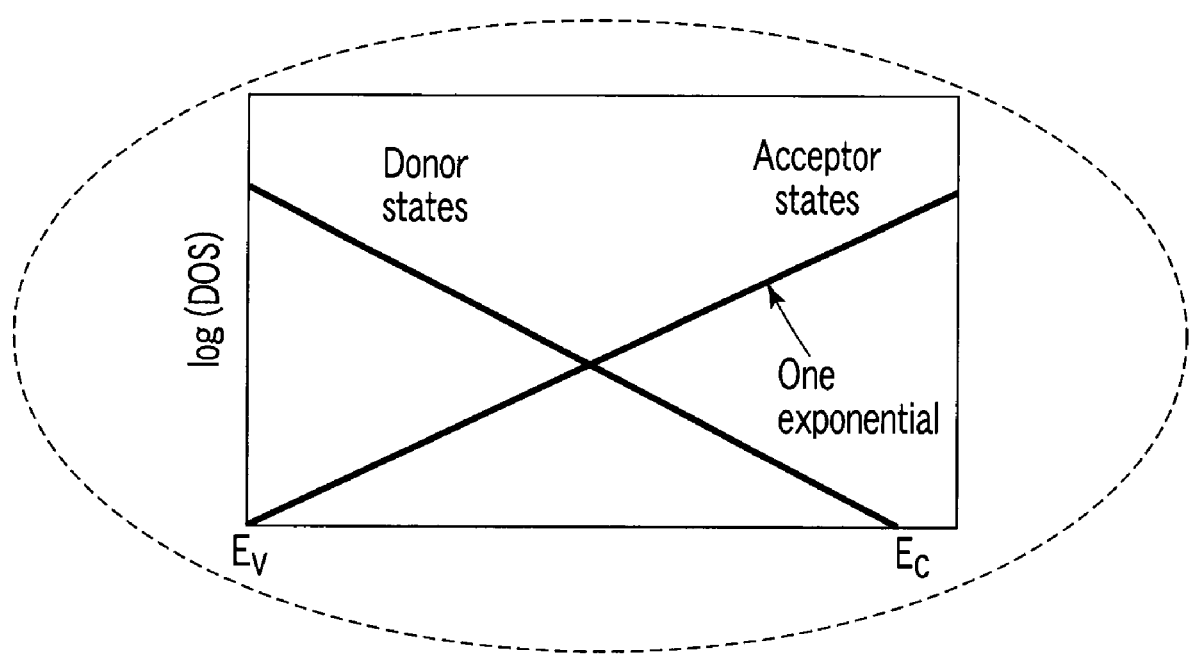
F I G. 6

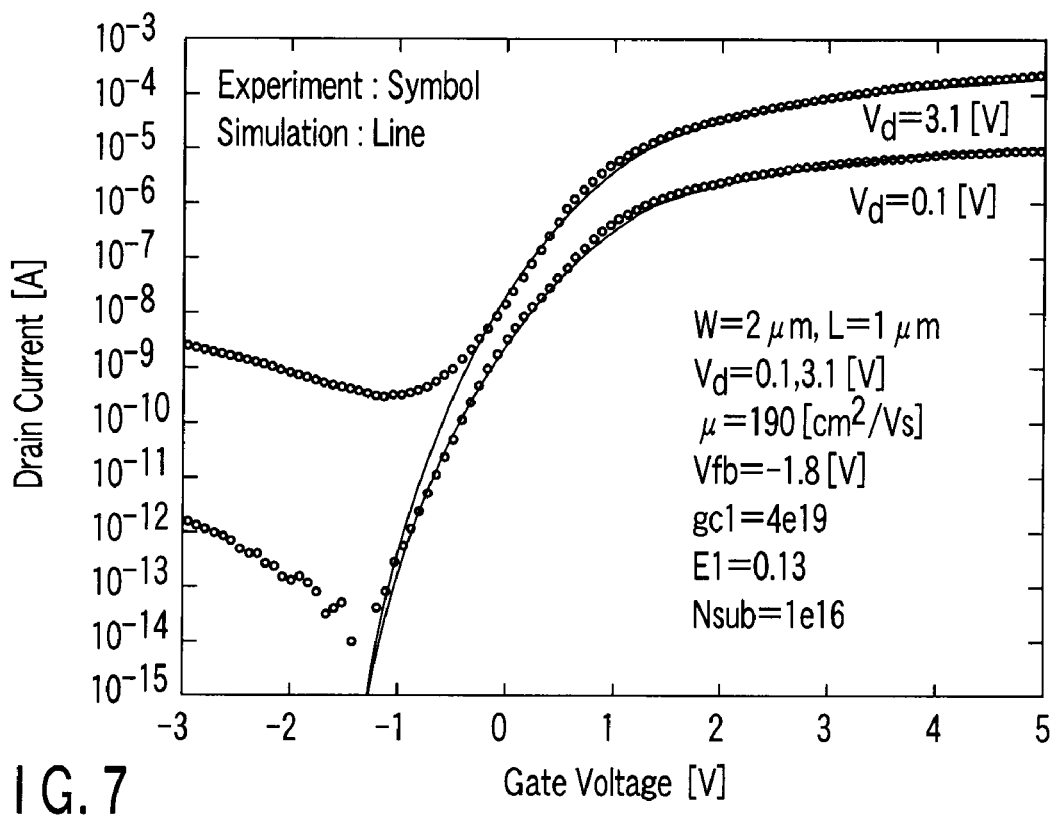
F I G. 7
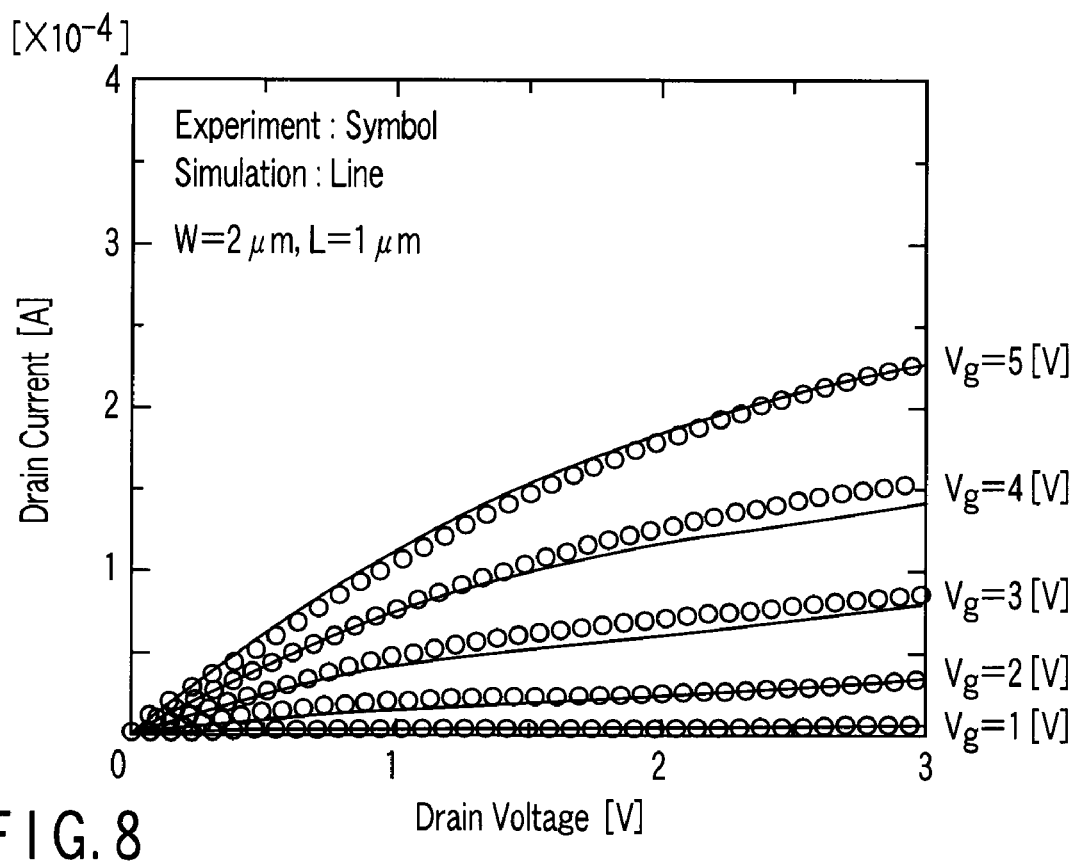
F I G. 8

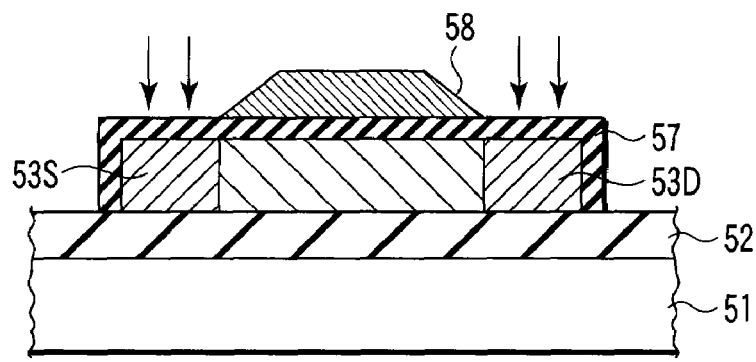
F I G. 17
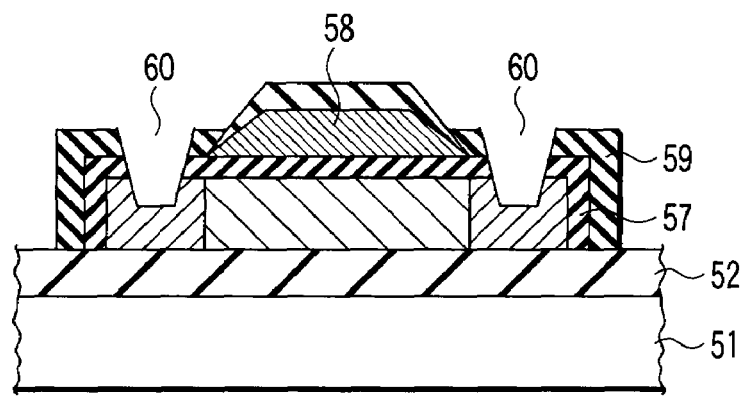
F I G. 18
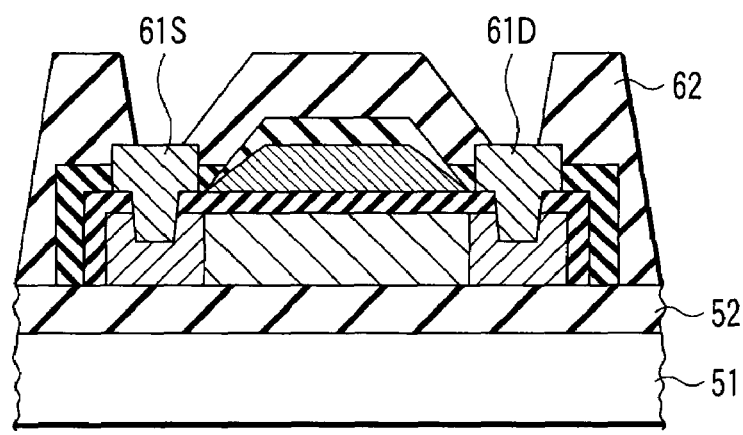
F I G. 19

Crystal Si (grain) having various plane orientations

Actual Poly-Si

—— Grain boundary

Crystal Si with uniformly distributed traps

Poly-Si model

Effective medium approximation

SIMULATION APPARATUS AND SIMULATION METHOD USED TO DESIGN CHARACTERISTICS AND CIRCUITS OF SEMICONDUCTOR DEVICE, AND SEMICONDUCTOR DEVICE FABRICATION METHOD

CROSS-REFERENCE TO RELATED APPLICATIONS

This application is based upon and claims the benefit of priority from prior Japanese Patent Application No. 2006-202195, filed Jul. 25, 2006, the entire contents of which are incorporated herein by reference.

BACKGROUND OF THE INVENTION

1. Field of the Invention

The present invention relates to a simulation apparatus and simulation method used to design the characteristics and circuits of a semiconductor device, and a semiconductor device fabrication method using this simulation method. More specifically, the present invention relates to a simulation technique for a transistor formed in a substrate containing defect states, and a semiconductor device fabrication technique using this simulation technique. Examples of the transistor are a thin-film transistor (TFT) in which a source region and drain region are formed apart from each other in a thin polysilicon film on an insulating substrate, and a gate electrode is formed on a gate insulating film on a channel region between the source and drain regions, and a transistor in which a source region and drain region are formed apart from each other in a polysilicon island region (silicon-on-insulator [SOI]) formed on an insulating substrate, and a gate electrode is formed on a gate insulating film on a channel region between the source and drain regions.

2. Description of the Related Art

In semiconductor device circuit design, circuit characteristics are generally predicted by using a circuit analyzing simulator. The Simulation Program with Integrated Circuit Emphasis (SPICE) created by the University of California, Berkeley (UCB), is most often used as a software tool for use in circuit simulation. A device model used in this simulator is generally called a compact model that is simplified in order to obtain calculation results within a relatively short time.

Under such circumstances, for a metal oxide semiconductor (MOS) transistor that changes the impedance between the source and drain regions by controlling the surface charge density of a semiconductor layer by changing its surface potential by the gate voltage, a general approach is to use different voltage-current expressions in a weak inversion region (subthreshold—weak inversion region) in which the gate voltage is relatively low and the drain current starts flowing and a strong inversion region in which the gate voltage is sufficiently high and the drain current is large.

Representative transistor models derived from this technical approach are a series called Berkeley Short-Channel IGFET Model (BSIM) (e.g., BSIM 4.3.0 MOSFET Model, User's Manual, Department of Electrical Engineering and Computer Science, University of California, Berkeley, Calif. [2003]). Of the drain current as the sum of a diffusion current and drift current, these models use only the diffusion current in the weak inversion region where the diffusion current component is dominant, and use only the drift current in the strong inversion region where the drift current is dominant.

That is, diffusion current approximation is performed in the weak inversion region as indicated by $$I_D = I_{on} \exp\left(\frac{V_{GS} - V_{on}}{\zeta V_T}\right)$$

Drift current approximation is performed in the strong inversion region as indicated by $$I_D = \mu C_{ox} \frac{W}{L}$$
$$\left\{(V_{GS} - V_{TH0})V_{DS} - \frac{V_{DS}^2}{2} - \frac{2}{3}\gamma\left[(V_{DS} - V_{BS} + 2\phi_F)^{\frac{3}{2}} - (-V_{BS} + 2\phi_F)^{\frac{3}{2}}\right]\right\}$$

where $I_D$ is the drain current, $I_{on}$ is a diffusion current exponential function coefficient, $V_{GS}$ is the gate-to-source voltage, $V_{on}$ is the diffusion current offset voltage, $\zeta$ is a diffusion current thermal voltage coefficient, $V_T$ is the thermal voltage, $\mu$ is the carrier mobility, $C_{ox}$ is the gate oxide film capacitance, W is the channel width, L is the channel length, $V_{TH0}$ is the threshold voltage, $V_{DS}$ is the drain-to-source voltage, $\gamma$ is a coefficient of the substrate biasing effect, $V_{BS}$ is the substrate (bulk)-to-source voltage, and $\phi_F$ is the Fermi level.

Using different expressions to calculate currents in different operating regions as described above simplifies the expressions and facilitates the analysis. This makes it possible to advantageously shorten the calculation time.

In a so-called piece-wise model (level 2 SPICE model, to be referred to as a drift model hereinafter) that changes the voltage-current expression in accordance with an operating region, however, as shown in FIG. 20A, the differential value of a current is discontinuous in the boundary (hatched region near threshold voltage $V_{TH}$ of a transistor) between the weak inversion region and strong inversion region. As a consequence, a large error as shown in FIG. 20B may occur in this boundary, so approximation is performed by using a qualitatively correct curve as shown in FIG. 20C.

The piece-wise model, therefore, is inconvenient for the analysis of, e.g., an analog circuit that operates from the weak inversion region to the strong inversion region. Also, since the channel length has recently decreased to about 100 nm, the reliability of the drift model has decreased.

Accordingly, attempts have been made to solve the drift diffusion model expression as the basic expression of a current without separating the expression in accordance with an operating region. A representative attempt is a model called the Hiroshima University STARC IGFET Model (HiSIM). This model uses a method of calculating the surface charge by deriving the surface potential by a single expression (diffusion-drift expression) in the operation from weak inversion to strong inversion of a transistor (MOSFET), thereby obtaining a current. M. Miura-Mattausch et al., "Unified complete MOSFET model for analysis of digital and analog circuits", IEEE Trans. CAD/ICAS vol. 15, pp. 1-7 (1996) describes that the voltage-current characteristic of a MOSFET obtained by this method can extremely well reproduce a measured value.

The technique that forms amorphous silicon (amorphous-Si) on an insulating substrate such as a glass substrate and forms polysilicon close to single-crystal silicon by using the laser crystallization technique has recently advanced. Attempts that integrate functional circuits in this polysilicon substrate or amorphous silicon substrate have been extensively made. Incorporating circuits in the polysilicon substrate or amorphous silicon substrate eliminates disconnection at circuit connecting points and the like. This increases the reliability and reduces the fabrication cost.

At present, however, it is still difficult to obtain perfect single-crystal silicon even by using the laser crystallization technique. As shown in FIG. 21A, polysilicon contains many single-crystal silicon grains having various plane orientations, and trap states (defect states or localized states) for trapping carriers exist in the grain boundaries. Also, amorphous silicon has many localized states. Furthermore, interface states resulting from dangling bonds of a silicon crystal exist in the interface between a silicon layer and an oxide film in contact with the silicon layer. In addition, the formation temperature of an oxide film formed on polysilicon or amorphous silicon on a glass substrate is as low as about 500° C. This makes the number of interface states immeasurably larger than that of an ordinary MOSFET.

When the localized states or interface states as described above exist, the physical mechanisms of device operations complicate. The present circuit analyzing models for insulated-gate transistors using polysilicon or amorphous silicon are not models of these physical mechanisms, but models that merely introduce fitting parameters for simply fitting the physical properties of devices. Accordingly, these models have low accuracy and are not necessarily satisfactory.

This is so because the operation model of an insulated-gate transistor containing localized states is not necessarily based on a physical model, but uses simple fitting parameters for simulating measured device characteristics.

Since the operation model is not based on a physical model, if the channel length or the like has changed, prototype devices having the same channel length are fabricated, and the device parameters are extracted. Following this procedure prolongs the time necessary to obtain an accurate circuit analyzing device model. Also, for an insulated-gate transistor using polysilicon or amorphous silicon having a physical mechanism more complicated than that of single-crystal silicon, the number of parameters of a device model often increases, so there is no convenient device model.

As described above, for a TFT formed in a polysilicon layer on an insulating substrate or for a transistor formed on an SOI substrate, there is no circuit model based on a physical model including defect states, and many fitting parameters are necessary. Accordingly, it takes a long time to obtain an accurate circuit analyzing device model. For a transistor formed in polysilicon or amorphous silicon, therefore, the number of parameters of a device model increases, and this makes the device model inconvenient.

BRIEF SUMMARY OF THE INVENTION

It is, therefore, an object of the present invention to provide a simulation apparatus and simulation method capable of performing accurate circuit analysis within a relatively short time on the basis of a physical model including defect states.

It is another object of the present invention to provide a simulation apparatus and simulation method capable of simulating measured transistor characteristics with a relatively small number of fitting parameters, thereby improving the convenience.

It is still another object of the present invention to provide a semiconductor device fabrication method capable of obtaining the optimum performance of a transistor formed in a polysilicon layer on an insulating substrate and the optimum performance of a circuit including this transistor, by performing circuit design simulation by using the above simulation method.

According to an aspect of the present invention, there is provided a simulation apparatus which simulates device characteristics of a transistor in which a source region and a drain region are formed apart from each other in a polysilicon layer on an insulating substrate, and a gate electrode is formed on a channel region between the source region and the drain region via a gate insulating film, the apparatus comprising an input unit which inputs a device model equation of the transistor and an initial value of a device parameter, a storage unit which stores the device model equation and the initial value of the device parameter input from the input unit, and a desired voltage-current characteristic of the transistor, an arithmetic unit which performs an arithmetic operation on the basis of the initial value of the device parameter stored in the storage unit to calculate a first potential $\phi_{S0}$ at a source region end adjacent to a gate electrode end on a surface, which faces the gate electrode, of the polysilicon layer of the transistor, a second potential $\phi_{b0}$ at the source region end on a surface, which faces the insulating substrate, of the polysilicon layer, a third potential $\phi_{SL}$ at a drain region end adjacent to the gate electrode end on the surface, which faces the gate electrode, of the polysilicon layer of the transistor, and a fourth potential $\phi_{bL}$ at the drain region end on the surface, which faces the insulating substrate, of the polysilicon layer, and calculates a drain current $I_{ds}$ by substituting the first potential $\phi_{S0}$, the second potential $\phi_{b0}$, the third potential $\phi_{SL}$, and the fourth potential $\phi_{bL}$ into the device model equation stored in the storage unit, a controller which controls the input unit, the storage unit, and the arithmetic unit to compare the desired voltage-current characteristic of the transistor stored in the storage unit with a voltage-current characteristic based on the drain current $I_{ds}$ obtained by the arithmetic operation by the arithmetic unit, and obtain a model parameter by changing the device parameter until a difference becomes not more than an allowable error, and an output unit which outputs the model parameter obtained by the arithmetic operation by the arithmetic unit, under the control of the controller, wherein the device model equation is represented by $$I_{ds} = \frac{W}{L}\mu\frac{IDD}{\beta}$$

$$IDD = C_{ox}(\beta V'_g + 1)(\phi_{SL} - \phi_{S0}) - \frac{\beta}{2}C_{ox}(\phi^2_{SL} - \phi^2_{S0}) - \frac{\beta}{2}\{q_i(0) + q_i(L)\}(\phi_{SL} - \phi_{S0}) - \{q_i(0) - q_i(L)\}$$

in which a charge amount $q_i(0)$ at the source region end is obtained by $$q_i(0) = \sqrt{\frac{2q\varepsilon_{si}N_{sub}}{\beta}}\left[\begin{array}{c}\exp(-\beta\phi_{S0}) - \exp(-\beta\phi_{b0}) + \\ \beta(\phi_{S0} - \phi_{b0}) + \left(\frac{\beta}{\gamma}\frac{N_{tS0}}{N_{sub}}\right) \\ \{\exp(\gamma\phi_{S0}) - \exp(\gamma\phi_{b0})\}\end{array}\right]^{\frac{1}{2}}$$

and a charge amount $q_i(L)$ at the drain region end is obtained by $$q_i(L) = \sqrt{\frac{2q\varepsilon_{si}N_{sub}}{\beta}}\left[\begin{array}{c}\exp(-\beta\phi_{SL}) - \exp(-\beta\phi_{bL}) + \\ \beta(\phi_{SL} - \phi_{bL}) + \left(\frac{\beta}{\gamma}\frac{N_{tD0}}{N_{sub}}\right) \\ \{\exp(\gamma\phi_{SL}) - \exp(\gamma\phi_{bL})\}\end{array}\right]^{\frac{1}{2}}$$

where W is a channel width of the transistor, L is a channel length of the transistor, $\mu$ is carrier mobility, IDD is a total surface charge amount, $\beta$ is a reciprocal of a thermal voltage, $C_{ox}$ is a gate oxide film capacitance, $V_g'$ is a voltage obtained by subtracting a flat-band voltage from a gate-to-source voltage, q is an elementary charge, $\in_{si}$ is a dielectric constant of silicon, $N_{sub}$ is a substrate impurity concentration, $N_{tS0}$ is a density of carriers trapped at the source region end, $N_{tD0}$ is a density of carriers trapped at the drain region end, and γ is a coefficient of a substrate biasing effect, and a model is formed by including defect states in the polysilicon layer in which the transistor is formed.

According to another aspect of the present invention, there is provided a simulation method of simulating device characteristics of a transistor in which a source region and a drain region are formed apart from each other in a polysilicon layer on an insulating substrate, and a gate electrode is formed on a channel region between the source region and the drain region via a gate insulating film, the method comprising inputting a device model equation of the transistor from an input unit and storing the input device model equation in a storage unit, inputting an initial value of a device parameter of the transistor from the input unit and storing the input initial value of the device parameter in the storage unit, inputting a desired voltage-current characteristic of the transistor from the input unit and storing the input desired voltage-current characteristic in the storage unit, performing an arithmetic operation by an arithmetic unit on the basis of the initial value of the device parameter stored in the storage unit, thereby calculating a first potential $\phi_{S0}$ at a source region end adjacent to a gate electrode end on a surface, which faces the gate electrode, of the polysilicon layer of the transistor, a second potential $\phi_{b0}$ at the source region end on a surface, which faces the insulating substrate, of the polysilicon layer, a third potential $\phi_{SL}$ at a drain region end adjacent to the gate electrode end on the surface, which faces the gate electrode, of the polysilicon layer of the transistor, and a fourth potential $\phi_{bL}$ at the drain region end on the surface, which faces the insulating substrate, of the polysilicon layer, performing an arithmetic operation by the arithmetic unit by substituting the first potential $\phi_{S0}$, the second potential $\phi_{b0}$, the third potential $\phi_{SL}$, and the fourth potential $\phi_{bL}$ into the device model equation stored in the storage unit, thereby calculating a drain current $I_{ds}$, comparing the desired voltage-current characteristic of the transistor with a voltage-current characteristic based on the drain current $I_{ds}$ obtained by the arithmetic operation, and controlling the input unit, the storage unit, and the arithmetic unit by a controller, and performing an arithmetic operation by the arithmetic unit by changing the device parameter until a result of the comparison between the voltage-current characteristics becomes not more than an allowable error, thereby obtaining a model parameter, wherein a simulation is performed using the device model equations.

According to still another aspect of the present invention, there is provided a semiconductor device fabrication method comprising determining target performance of a semiconductor device to be fabricated designing an outline for implementing the target performance, designing individual elements, performing circuit design simulation by using a device model equation, and changing various parameters of a circuit on the basis of a prediction result obtained by the circuit design simulation, thereby fabricating the semiconductor device so as to obtain the target performance, wherein the semiconductor device to be fabricated comprises a transistor in which a source region and a drain region are formed apart from each other in a polysilicon layer on an insulating substrate, and a gate electrode is formed on a channel region between the source region and the drain region via a gate insulating film, wherein performing the circuit design simulation by using the device model equation comprises, storing, in a storage unit, a program describing an instruction for controlling a controller, inputting the device model equation of the transistor from an input unit and storing the input device model equation in the storage unit, inputting an initial value of a device parameter of the transistor from the input unit and storing the input initial value of the device parameter in the storage unit, inputting a desired voltage-current characteristic of the transistor from the input unit and storing the input desired voltage-current characteristic in the storage unit, inputting a device parameter, a circuit diagram, and a circuit driving condition from the input unit, and storing the input device parameter, circuit diagram, and circuit driving condition in the storage unit, performing an arithmetic operation by an arithmetic unit on the basis of the initial value of the device parameter stored in the storage unit, thereby calculating a first potential $\phi_{S0}$ at a source region end adjacent to a gate electrode end on a surface, which faces the gate electrode, of the polysilicon layer of the transistor, a second potential $\phi_{b0}$ at the source region end on a surface, which faces the insulating substrate, of the polysilicon layer, a third potential $\phi_{SL}$ at a drain region end adjacent to the gate electrode end on the surface, which faces the gate electrode, of the polysilicon layer of the transistor, and a fourth potential $\phi_{bL}$ at the drain region end on the surface, which faces the insulating substrate, of the polysilicon layer, performing an arithmetic operation by the arithmetic unit by substituting the calculated first potential $\phi_{S0}$, second potential $\phi_{b0}$, third potential $\phi_{SL}$, and fourth potential $\phi_{bL}$ into the device model equation stored in the storage unit, thereby calculating a drain current $I_{ds}$, comparing the desired voltage-current characteristic of the transistor with a voltage-current characteristic based on the drain current obtained by the arithmetic operation, controlling the input unit, the storage unit, and the arithmetic unit by a controller, and performing an arithmetic operation by the arithmetic unit by changing the device parameter until a result of the comparison between the voltage-current characteristics becomes not more than an allowable error, thereby obtaining a model parameter, and in accordance with the program stored in the storage unit, performing an arithmetic operation by the arithmetic unit on the basis of the model parameter, the circuit diagram, and the circuit driving condition, under the control of the controller, thereby simulating circuit characteristics, wherein a simulation is performed using the device model equations.

According to an aspect of the present invention, there are provided a simulation apparatus and simulation method capable of accurate circuit analysis by performing simulation on the basis of a physical model including defect states by using a device model equation that introduces the effect of defect states to a Poisson equation as the basic equation of a circuit model.

In addition, since the simulation is performed on the basis of a physical model, device parameters can be readily extracted even when the channel length or the like has changed. This makes it possible to obtain an accurate circuit analyzing device model within a short time.

Also, even for a transistor using polysilicon having a physical mechanism more complicated than that of single-crystal silicon, it is possible to obtain a simulation apparatus and simulation method capable of simulating measured transistor characteristics by using four fitting parameters, i.e., the carrier mobility, the flat-band voltage, the peak concentration that gives a defect concentration distribution, and the acceptor-type defect concentration distribution slope, thereby improving the convenience.

Furthermore, it is possible to obtain a semiconductor device fabrication method capable of optimizing the characteristics of a transistor formed in a polysilicon layer on an insulating substrate and the characteristics of a circuit including this transistor, by performing circuit design simulation by using the above simulation method.

BRIEF DESCRIPTION OF THE SEVERAL VIEWS OF THE DRAWING

FIG. 3A is a schematic view for explaining the relationship between a simulation model used in the present invention and an equation to be solved, which shows the relationship between a device model and the equation to be solved;

FIG. 3B is a schematic view for explaining the relationship between a simulation model used in the present invention and an equation to be solved, which shows the relationship between a device model and the equation to be solved;

FIG. 6 is a diagram showing a simplified model representing two exponential function distributions by one exponential function;

FIG. 7 is a $V_g$-$I_d$ graph showing the results of fitting of a polysilicon TFT performed by a device model used in the present invention;

FIG. 8 is a $V_d$-$I_d$ graph showing the results of fitting of a polysilicon TFT performed by a device model used in the present invention;

FIG. 17 is a sectional view for explaining the semiconductor device fabrication method according to the fifth embodiment of the present invention, which shows the fourth fabrication step of the transistor;

FIG. 18 is a sectional view for explaining the semiconductor device fabrication method according to the fifth embodiment of the present invention, which shows the fifth fabrication step of the transistor;

FIG. 19 is a sectional view for explaining the semiconductor device fabrication method according to the fifth embodiment of the present invention, which shows the sixth fabrication step of the transistor;

DETAILED DESCRIPTION OF THE INVENTION

The process of speculation reaching a device model for use in a simulation apparatus and simulation method according to an embodiment of the present invention will be explained first, and then various embodiments using the device model will be explained.

The simulation apparatus and simulation method according to the embodiment of the present invention are suitable for design simulation of a circuit including a thin-film transistor (TFT) formed in a thin semiconductor film, e.g., a thin polysilicon film on an insulating substrate, or a transistor formed on an SOI substrate (referred to as an SOI transistor hereinafter). For example, as explained with reference to FIG. 21A, polysilicon contains a number of fine single-crystal silicon grains having various plane orientations. In this polysilicon, many localized states based on crystal defects exist in the boundary between adjacent single crystals, i.e., in the grain boundary. Although the internal material of polysilicon is heterogeneous as described above, a circuit model is formed by handling polysilicon as a homogeneous material by neglecting this heterogeneity. This assumption is presumably effective when crystal grains are much smaller than the dimensions of a device.

Assume that a thin film semiconductor device as an object of simulation according to the present invention is a so-called unipolar element in which electrons are dominant carriers of a current if the element is an N-channel element and holes are dominant carriers of a current if the element is a P-channel element. Also, assuming that a current flows only on the surface, the charge distribution on the surface of a silicon layer below the gate determines the voltage-current characteristic of the device, and the surface potential of the silicon layer determines the surface charge. Accordingly, obtaining the voltage-current characteristic of the transistor is equivalent to obtaining the potential distribution on the silicon layer surface.

The basis of a method of deriving a device model for use in the present invention is to obtain the surface potential described above. A Poisson equation gives the potential distribution of a device. A device is originally a three-dimensional structure, but can be reduced to a two-dimensional structure if it is assumed that a widthwise current flows evenly in the channel. A device can also be reduced to a one-dimensional structure if a so-called charge sheet model holds in which it is assumed that a current flows in only a surface layer that is extremely thin compared to the channel length.

The basis of this device model is to solve a one-dimensional Poisson equation on the basis of these assumptions. The points of the procedure of obtaining the surface charge of a device by using this device model will be described below.

Figure 2:
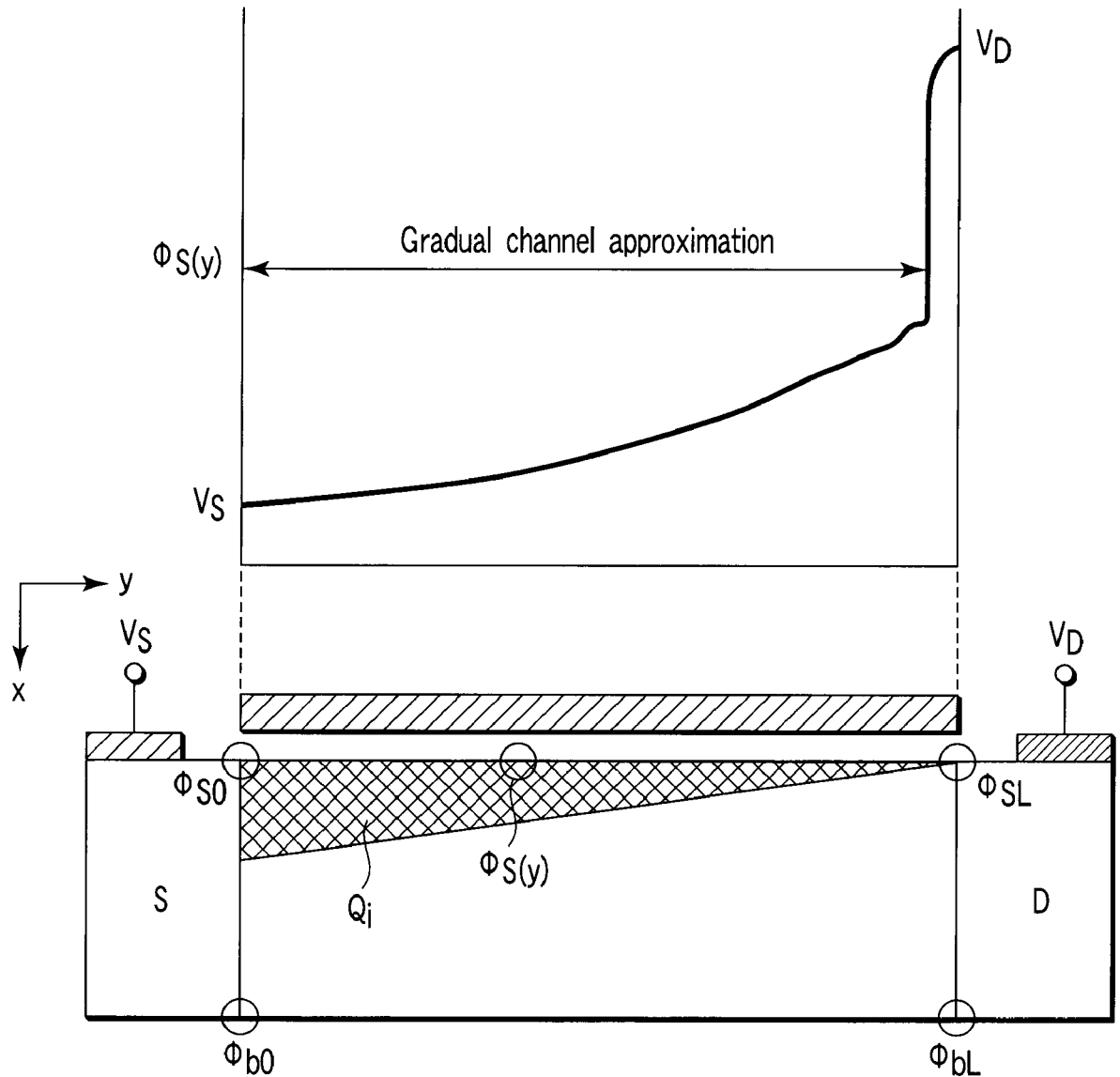
FIG. 2 is a schematic view for explaining the relationship between a simulation model used in the present invention and an equation to be solved when a device (transistor) is in operation.

FIGS. 2, 3A, and 3B are views for explaining the relationship between this simulation apparatus and an equation to be solved. FIG. 2 is a schematic view when a device (transistor) is in operation. FIGS. 3A and 3B are schematic views showing the relationship between a simulation model and the equation to be solved. The surface potential distribution determines the surface charge. In this case, so-called gradual channel approximation which assumes that the potential change from the source electrode to the drain electrode is moderate is used (FIG. 2). This approximate makes it possible to estimate the potential distribution in the channel region from the potentials at two points, i.e., a surface potential $\phi_{S0}$ at the source region end and a surface potential $\phi_{SL}$ at the drain region end. The surface potentials $\phi_{S0}$ and $\phi_{SL}$ at the source region end and drain region end can be obtained by solving a one-dimensional Poisson equation and Gauss law in the direction of depth of the source region end and drain region end (FIG. 3A).

On the other hand, a device as an object of the simulation model is a TFT formed in a thin polysilicon film on an insulating substrate, or a transistor formed on an SOI substrate. The characteristic features of these devices are that they are as thin as a few ten nm to a few hundred nm. Since a silicon layer is thin, the device under operation is in a fully depleted state in which the whole device is depleted, or in a partially depleted state.

That is, the potential of the back surface of the silicon layer is not a zero potential but has a certain value. This back surface potential depends on the factors of the device structure such as the thickness of the silicon layer, the impurity concentration, and the thickness of the gate oxide film, and the gate voltage. Accordingly, the surface potential and back surface potential are not independent but have a predetermined relationship. As shown in FIG. 3B, an electric charge $Q_G$ induced in the gate electrode is represented by the sum of an inversion layer charge $Q_I$ induced on the semiconductor surface, a depletion layer charge $Q_B$ of the semiconductor layer, and an electric charge (trapped charge) $Q_{trap}$ trapped by defect states, as indicated by $$Q_G = -(Q_I + Q_B + Q_{trap})$$

Also, a gate voltage $V_{GS}$ and semiconductor surface potential $\phi_S$ are associated by the charge balancing condition indicated by $$Q_G = C_{ox}(V_{GS} - V_{fb} - \phi_s)$$

where $C_{ox}$ is the gate oxide film capacitance, and $V_{fb}$ is the flat-band voltage.

The surface potential $\phi_{S0}$ and back surface potential $\phi_{b0}$ at the source region end are calculated by using the equations as described above.

The surface potential $\phi_{SL}$ and back surface potential $\phi_{bL}$ at the drain region end can be represented by associating the potential and drain voltage at the source region end from a current continuity equation indicated by the quasi-Fermi level (QFL).

That is, a surface electron charge $Q_i(0)$ at the source region end is given by $$Q_i(0) = n_i \exp\left(\frac{q(\phi_{S0} - \psi_0)}{kT}\right)$$

where $n_i$ is the intrinsic carrier concentration, $\phi_{S0}$ is the potential at the source region end, and $\psi_0$ is the quasi-Fermi potential of electrons at the source region end.

Similarly, a surface electron charge $Q_i(L)$ at the drain region end is given by $$Q_i(L) = n_i \exp\left(\frac{q(\phi_{SL} - \psi_L)}{kT}\right)$$

where $\phi_{SL}$ is the potential at the drain region end, and $\psi_L$ is the quasi-Fermi potential of electrons at the drain region end.

The ratio of $Q_i(L)$ to $Q_i(0)$ is given by $$Q_i(L)/Q_i(0) = \exp\left[\frac{q\{(\phi_{SL} - \phi_{S0}) - (\psi_L - \psi_0)\}}{kT}\right]$$

On the other hand, since $\psi_L - \psi_0 = V_{ds}$, the surface potential $\phi_{SL}$ and back surface potential $\phi_{bL}$ at the drain region end can be represented by $$Q_i(L)/Q_i(0) = \exp\{\beta(\phi_{SL} - \phi_{S0} - V_{ds})\}$$

for $\beta = q/kT$

A drain current $I_{ds}$ is obtained from the potentials at the four points, i.e., the surface potentials $\phi_{S0}$ and $\phi_{SL}$ and back surface potentials $\phi_{b0}$ and $\phi_{bL}$ at the source region end and drain region end calculated following the above procedure.

Figure 21A:
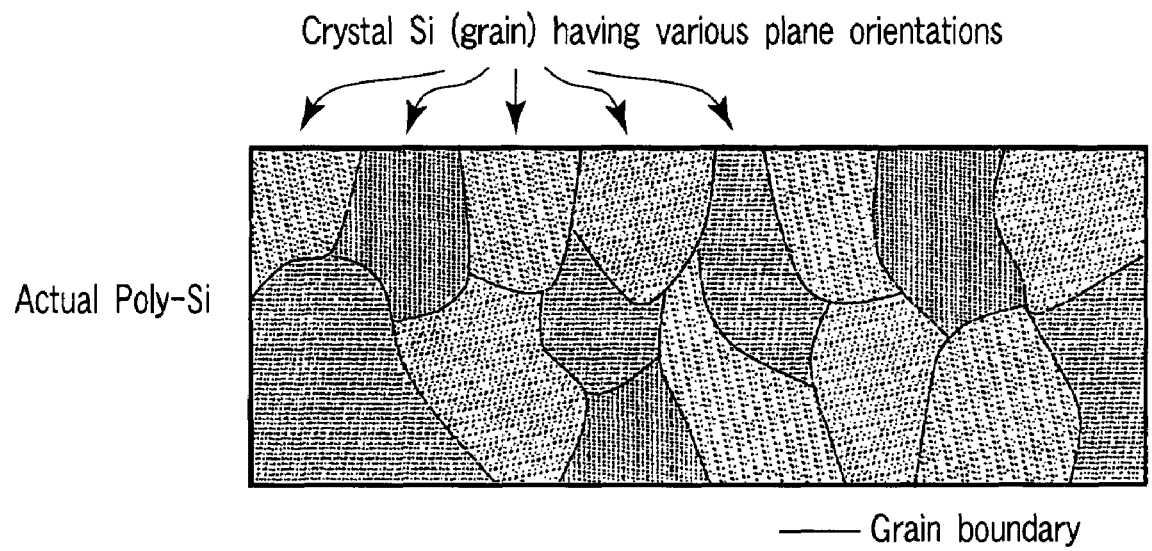
FIG. 21A is a view showing actual polysilicon (grains/grain boundaries)
Figure 21B:
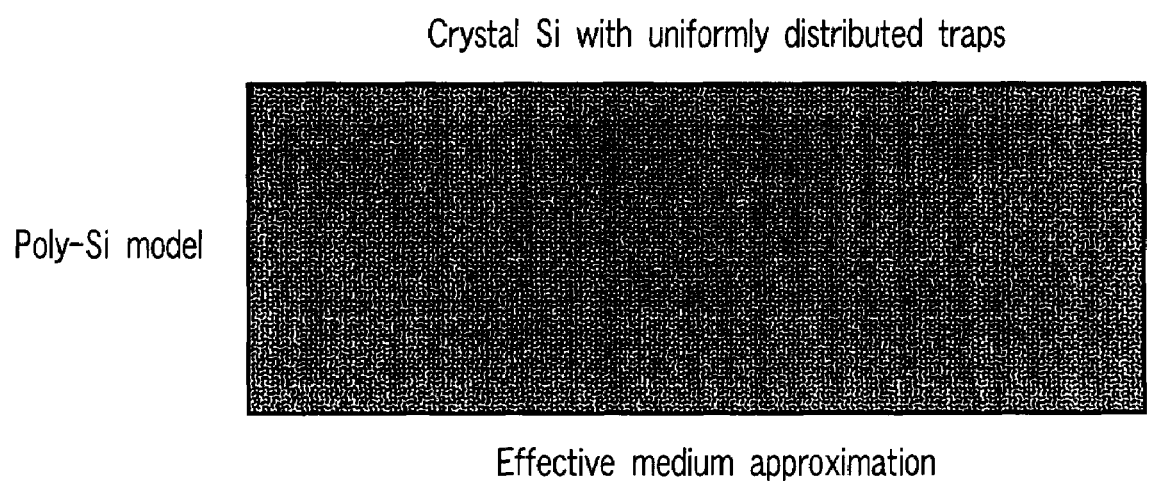
FIG. 21B is a diagram showing a modeled structure of polysilicon.

The present invention incorporates defect states existing in silicon as shown in FIG. 21A into a device model, and performs averaging by including the defect states in silicon in which a transistor is to be formed as shown in FIG. 21B.

That is, the effect of defect states is introduced to a Poisson equation as the basic equation of a circuit model. When taking an N-channel device as an example, a Poisson equation is $$\frac{d^2\phi}{dx^2} = \frac{q}{\varepsilon_{si}}(n - p + N_A + N_{trap})$$

and the effect of defect (trap) states indicated by $$N_{trap} = g_{c1} E_1 \exp\left(\frac{E_{Fn} - E_C + q\phi}{E_1}\right) \frac{\pi kT/E_1}{\sin(\pi kT/E_1)}$$

-continued $$= g_{c1}E_1 \cdot \frac{\pi kT/E_1}{\sin(\pi kT/E_1)} \cdot \exp\left(\frac{E_{Fn}-E_C}{E_1}\right) \cdot \exp\left(\frac{q}{E_1}\cdot\phi\right)$$

$$= N_{t0}\exp(\gamma\phi)$$

is introduced to a density $N_{trap}^-$ of trapped carriers in the above Poisson equation. This equation can be rewritten into $$N_{t0} = g_{c1}E_1 \cdot \frac{\pi kT/E_1}{\sin(\pi kT/E_1)} \cdot \exp\left(\frac{E_{Fn}-E_C}{E_1}\right)$$

$$\gamma = \frac{q}{E_1}$$

Figure 4A:
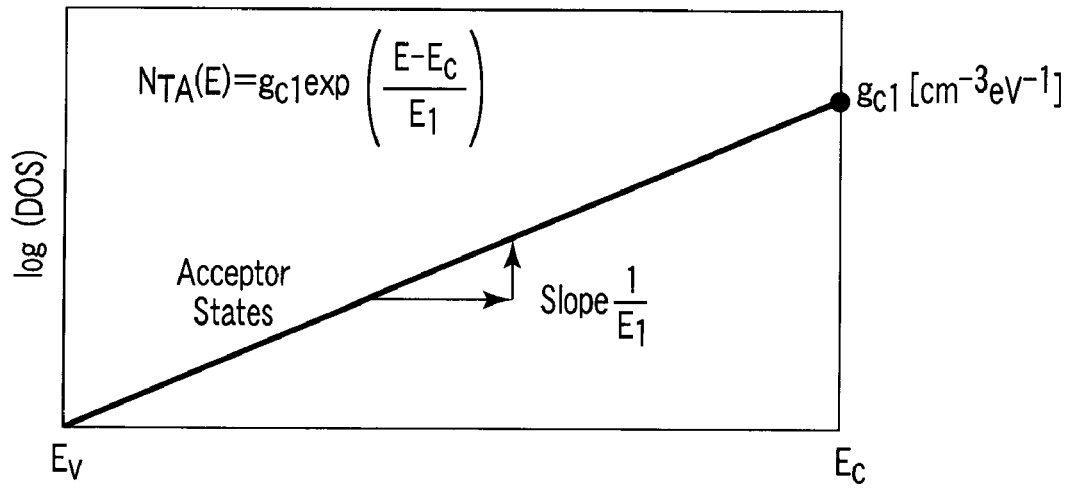
FIG. 4A is a diagram showing a defect concentration trap state density distribution used in a device model.

The above equation represents the trap state density by the exponential function of energy as shown in FIG. 4A by using various approximations.

Figure 4B:
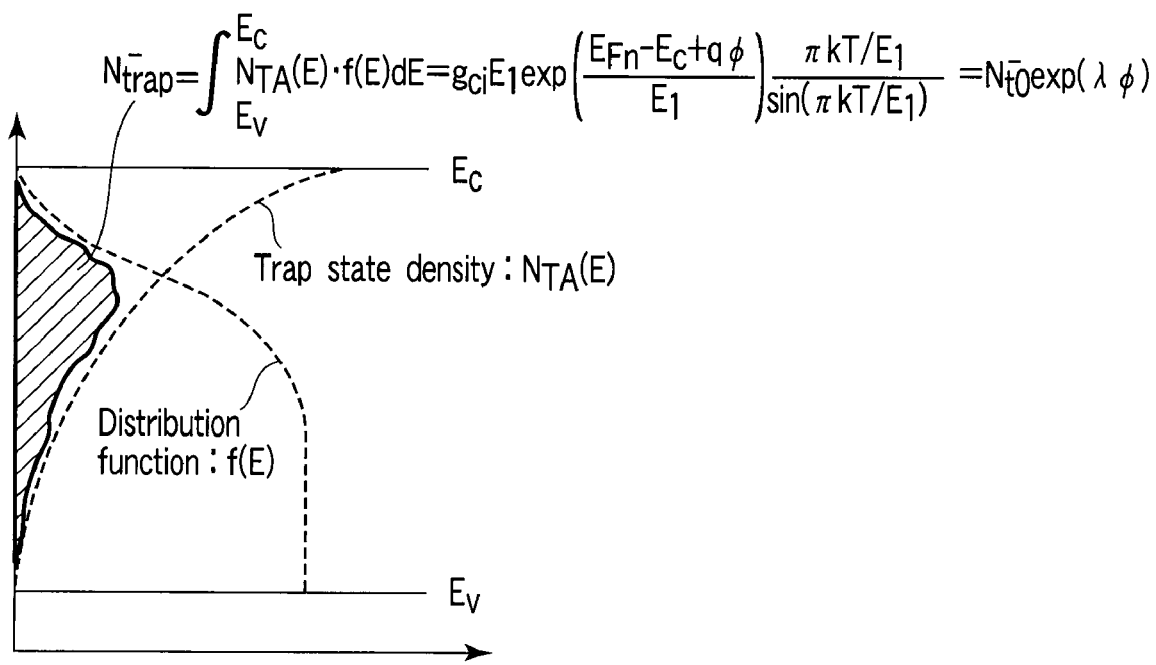
FIG. 4B is a diagram showing the relationship between the trap state density, a distribution function, and trapped carriers.

Also, as shown in FIG. 4B, the density ($N_{trap}^-$) of carriers trapped by the trap states can be calculated as the product of a trap state density $N_{TA}(E)$ and distribution function (Fermi-Dirac distribution) f(E). FIG. 4B shows the relationship between the trap state density, distribution function, and trapped carriers.

The distribution function f(E) is indicated by $$f(E) = \frac{1}{1+\exp\left(\frac{E-E_f}{V_T}\right)}$$

where $E_f$ is the Fermi energy, and $V_T$ is the thermal voltage.

Figure 5A:
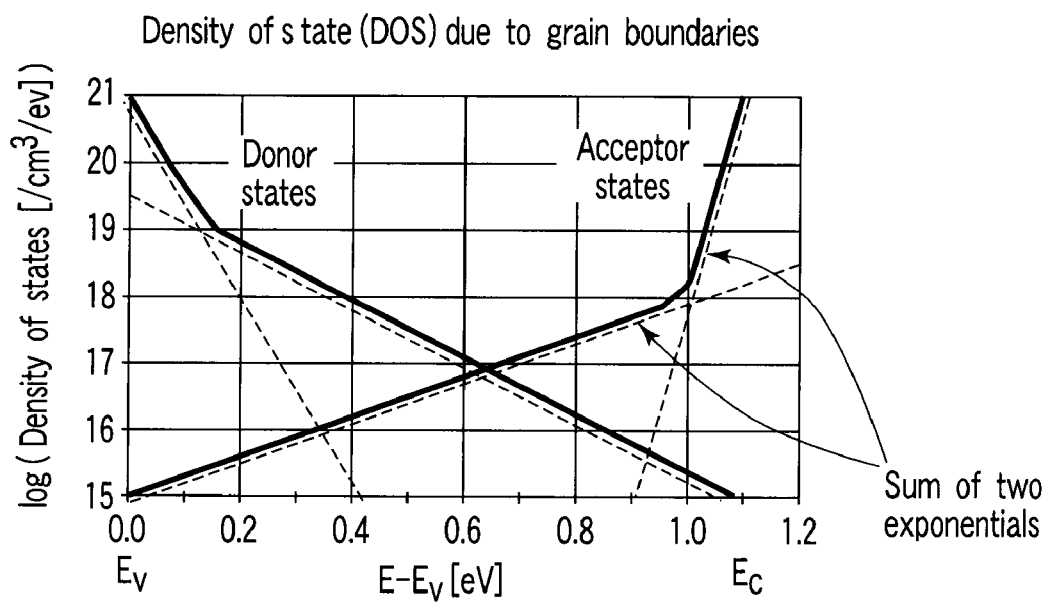
FIG. 5A is a diagram showing an example (DOS distribution) of the defect concentration distribution in polysilicon.

Note that a density-of-state (DOS) distribution represented by the sum of two exponential functions as shown in FIG. 5A is well known as an example of the defect distribution in polysilicon, and can be represented by $$g_A(E) = g_1\exp(E/E_1) + g_2\exp(E/E_2) \quad (1.0)$$

Figures 5B, 5C:
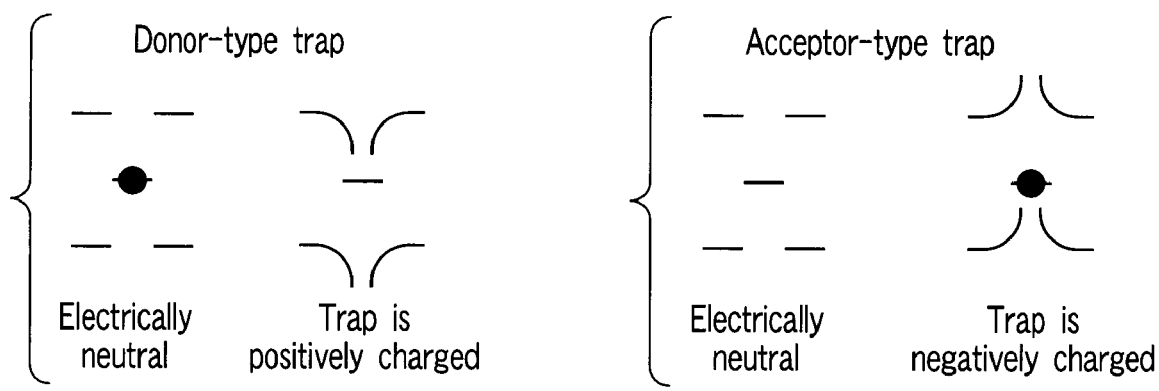
FIG. 5B is a diagram for explaining a donor-type trap.
FIG. 5C is a diagram for explaining an acceptor-type trap.

A donor-type trap shown in FIG. 5B is positively charged, and an acceptor-type trap shown in FIG. 5C is negatively charged. The defect distribution in polysilicon can be represented by the sum of the two exponential functions of the donor state and acceptor state.

Unfortunately, the processing time increases if a model is formed by using the DOS distribution as described above as an analytical equation. However, an analytical equation can be obtained by a simplified model as shown in FIG. 6 that represents two exponential function distributions by one exponential function, as described in, e.g., M. Shur and M. Hack, "Physics of amorphous silicon based alloy field-effect transistors", J. Appl. Phys., vol. 55, p. 3831 (1984). Since electrons are dominant as carriers in an N-channel device, approximation is performed by using only the acceptor-type trap.

This simulation model uses this DOS distribution model, and also includes defect states in a substrate (polysilicon layer) in which a transistor is formed.

The procedure of obtaining the above simulation model will be explained in detail below.

(1) Calculations (Surface Potential $\phi_{S0}$ [V] and Back Surface Potential $\phi_{b0}$ [V]) at Source Region End The surface potential $\phi_{S0}$ [V] is determined by calculating iteration by $$C_{OX}(V_g' - \phi_{S0}) = \quad (1.1)$$

$$\sqrt{\frac{2q\varepsilon_{si}N_{sub}}{\beta}} \begin{bmatrix} \exp(-\beta\phi_{S0}) - \exp(-\beta\phi_{b0}) + \beta(\phi_{S0}-\phi_{b0}) + \\ \beta(\phi_{S0}-\phi_{b0}) + \left(\frac{n_i}{N_{sub}}\right)^2 \{\exp(\beta\phi_{S0}) - \\ \exp(\beta\phi_{b0})\} + \left(\frac{\beta}{\gamma}\frac{N_{tS0}}{N_{sub}}\right)\{\exp(\gamma\phi_{S0}) - \\ \exp(\gamma\phi_{b0})\} \end{bmatrix}^{\frac{1}{2}}$$

for $$C_{ox} = \varepsilon_{ox}/t_{ox} \quad [F/cm^2]$$

$$V_g' = V_{gs} - V_{fb} \quad [V]$$

$$N_{tS0} = g_{c1}E_1\exp\left(\frac{E_{FS}-E_C}{E_1}\right)\frac{\pi kT/E_1}{\sin(\pi kT/E_1)}$$

$$E_{FS} - E_C = -\frac{1}{2}E_g - kT\ln\left(\frac{N_{sub}}{n_i}\right) \quad [eV]$$

$$\gamma = q/E_1 \quad [V^{-1}]$$

$$\phi_{b0} = \frac{1}{\beta}\ln[1+\exp\{\beta(\phi_{S0}-\Delta\phi_{Sb})\}] \quad [V]$$

$$\Delta\phi_{sb} = \frac{qN_{sub}}{2\varepsilon_{si}}t_{si}^2 \quad [V]$$

where $C_{ox}$ is the gate oxide film capacitance, $V_g'$ is the voltage obtained by subtracting the flat-band voltage from the gate-to-source voltage, q is the elementary charge, $\in_{si}$ is the dielectric constant of silicon, $N_{sub}$ is the substrate impurity concentration, β is the reciprocal of the thermal voltage and is q/kT (@300K), $N_{tS0}$ is the density of carriers trapped at the source region end, γ is a coefficient of the substrate biasing effect, $V_{gs}$ is the gate-to-source voltage, $V_{fb}$ is the flat-band voltage, $n_i$ is the intrinsic carrier density, $t_{ox}$ is the oxide film thickness, $\in_{ox}$ is the dielectric constant of the gate oxide film, $g_{c1}$ is the acceptor-type defect concentration distribution peak value, $E_c$ is the conduction band energy, and $E_1$ is the acceptor-type defect concentration distribution slope. Note that k is a Boltzmann's constant, T is the absolute temperature, and K is the Kelvin temperature. Note also that Fermi energy $E_{FS}$ on the source side is represented by $E_{FS}=E_{FN}+q\phi$ where $E_{FN}$ is the Fermi energy of electrons (in the case of an N-channel transistor).

Then, the back surface potential $\phi_{b0}$ [V] is calculated by substituting the surface potential $\phi_{S0}$ [V] obtained from equation 1.1 into $$\phi_{b0} = \frac{1}{\beta}\ln[1+\exp\{\beta(\phi_{S0}-\Delta\phi_{Sb})\}] \quad (1.2)$$

From the above calculations, the surface potential $\phi_{S0}$ [V] and back surface potential $\phi_{b0}$ [V] at the source region end are obtained.

(2) Calculations (Surface Potential $\phi_{SL}$ [V] and Back Surface Potential $\phi_{bL}$ [V]) at Drain Region End The surface potential $\phi_{S0}$ [V] and back surface potential $\phi_{b0}$ [V] obtained from equations 1.1 and 1.2 are used to determine the surface potential $\phi_{SL}$ [V] by calculating iteration by $$\beta\phi_{SL} = \beta\phi_{S0} + \beta V_{ds} + \ln\frac{Q_i(L)}{Q_i(0)} \quad (1.3)$$

for $$Q_i(0) = -C_{ox}(V'_g - \phi_{S0}) +$$

$$\sqrt{\frac{2q\varepsilon_{si}N_{sub}}{\beta}}\left[\begin{array}{c}\exp(-\beta\phi_{S0}) - \exp(-\beta\phi_{b0}) + \\ \beta(\phi_{S0} - \phi_{b0}) + \left(\frac{\beta}{\gamma}\frac{N_{tS0}}{N_{sub}}\right) \\ \{\exp(\gamma\phi_{S0}) - \exp(\gamma\phi_{b0})\}\end{array}\right]^{\frac{1}{2}} [c/cm^2]$$

$$Q_i(L) = -C_{ox}(V'_g - \phi_{SL}) +$$

$$\sqrt{\frac{2q\varepsilon_{si}N_{sub}}{\beta}}\left[\begin{array}{c}\exp(-\beta\phi_{SL}) - \exp(-\beta\phi_{bL}) + \\ \beta(\phi_{SL} - \phi_{bL}) + \left(\frac{\beta}{\gamma}\frac{N_{tD0}}{N_{sub}}\right) \\ \{\exp(\gamma\phi_{SL}) - \exp(\gamma\phi_{bL})\}\end{array}\right]^{\frac{1}{2}} [c/cm^2]$$

$$C_{ox} = \varepsilon_{ox}/t_{ox} \ [F/cm^2]$$

$$V'_g = V_{gs} - V_{fb} \ [V]$$

$$N_{tDo} = g_{c1}E_1\exp\left(\frac{E_{FD} - E_C}{E_1}\right)\frac{\pi kT/E_1}{\sin(\pi kT/E_1)} \ [cm^{-3}]$$

$$E_{FD} - E_C = -\frac{1}{2}Eg - kT\ln\left(\frac{N_{sub}}{n_i}\right) - V_{ds} \ [eV]$$

$$\gamma = q/E_1 \ [V^{-1}]$$

$$\phi_{bL} = \frac{1}{\beta}\ln[1 + \exp\{\beta(\phi_{SL} - \Delta\phi_{Sb})\}] \ [V]$$

$$\Delta\phi_{sb} = \frac{qN_{sub}}{2\varepsilon_{si}}t_{si}^2 \ [V]$$

where $V_{ds}$ [V] is the drain-to-source voltage, and $N_{tDo}$ is the density of carriers trapped at the drain region end. Note also that Fermi energy $E_{FD}$ on the drain side is represented by $E_{FD} = E_{FN} + q\phi$.

Subsequently, the back surface potential $\phi_{bL}$ [V] is calculated by substituting the surface potential $\phi_{SL}$ [V] obtained from equation 1.3 into $$\phi_{bL} = \frac{1}{\beta}\ln[1 + \exp\{\beta(\phi_{SL} - \Delta\phi_{Sb})\}] \quad (1.4)$$

From the above calculations, the surface potential $\phi_{SL}$ [V] and back surface potential $\phi_{bL}$ [V] at the drain region end are obtained.

(3) Drain Current Equations

Letting $I_{ds}$ [A] be the drain current, the drain current $I_{ds}$ [A] can be calculated by using the four potentials ($\phi_{S0}$ [V], $\phi_{b0}$ [V], $\phi_{SL}$ [V], and $\phi_{bL}$ [V]) calculated in sections 1 and 2 as indicated by $$I_{ds} = \frac{W}{L}\mu\frac{IDD}{\beta} \quad (1.5)$$

$$IDD = C_{ox}(\beta V'_g + 1)(\phi_{SL} - \phi_{S0}) - \frac{\beta}{2}C_{ox}(\phi_{SL}^2 - \phi_{S0}^2) - \quad (1.6)$$
$$\frac{\beta}{2}\{q_i(0) + q_i(L)\}(\phi_{SL} - \phi_{S0}) - \{q_i(0) - q_i(L)\}$$

in which a charge amount $q_i(0)$ at the source region end is $$q_i(0) = \sqrt{\frac{2q\varepsilon_{Si}N_{sub}}{\beta}}\left[\exp(-\beta\phi_{S0}) - \exp(-\beta\phi_{b0}) + \right.$$
$$\left.\beta(\phi_{S0} - \phi_{b0}) + \left(\frac{\beta}{\gamma}\frac{N_{tS0}}{N_{sub}}\right)\{\exp(\gamma\phi_{S0}) - \exp(\gamma\phi_{b0})\}\right]^{\frac{1}{2}}$$

and a charge amount $q_i(L)$ at the drain region end is $$q_i(L) = \sqrt{\frac{2q\varepsilon_{Si}N_{sub}}{\beta}}\left[\exp(-\beta\phi_{SL}) - \exp(-\beta\phi_{bL}) + \right.$$
$$\left.\beta(\phi_{SL} - \phi_{bL}) + \left(\frac{\beta}{\gamma}\frac{N_{tD0}}{N_{sub}}\right)\{\exp(\gamma\phi_{SL}) - \exp(\gamma\phi_{bL})\}\right]^{\frac{1}{2}}$$

where q is the elementary charge, $\varepsilon_{si}$ is the dielectric constant of silicon, $\varepsilon_{ox}$ is the dielectric constant of the oxide film, $N_{sub}$ is the substrate impurity concentration, $\beta$ is the reciprocal of the thermal voltage, $n_i$ is the intrinsic carrier density, $t_{si}$ is the silicon layer thickness, $t_{ox}$ is the oxide film thickness, L is the channel length, W is the channel width, $\mu$ is the carrier mobility, $V_{fb}$ is the flat-band voltage, $E_g$ is the bandgap, $g_{c1}$ is the defect concentration peak value, $\phi_{S0}$ is the source region end surface potential, $\phi_{SL}$ is the drain region end surface potential, $\phi_{b0}$ is the source region end back surface potential, and $\phi_{bL}$ is the drain region end back surface potential.

FIGS. 7 and 8 illustrate the results of fitting of an N-channel TFT in a polysilicon layer obtained by the above-mentioned device model. FIG. 7 shows the $V_g$-$I_d$ characteristics, i.e., shows the drain current as a function of the gate voltage by comparing experimental values (o) with values (solid lines) obtained by simulation. The conditions of the polysilicon TFT are that the channel width W is 2 μm, the channel length L is 1 μm, the drain voltages $V_d$ are 0.1 and 3.1V, the carrier mobility μ is 190 cm²/Vs, the flat-band voltage $V_{fb}$ is −1.8V, the acceptor-type defect concentration distribution peak value $g_{c1}$ is 4×10¹⁹ cm⁻³·eV⁻¹, the acceptor-type defect concentration distribution slope $E_1$ is 0.13 eV⁻¹, and the substrate impurity concentration $N_{sub}$ is 1×10¹⁶ cm⁻³.

FIG. 8 shows the $V_d$-$I_d$ characteristics, i.e., shows the drain current as a function of the drain voltage by comparing experimental values (o) with values (solid lines) obtained by simulation. The conditions of the polysilicon TFT are that the channel width W is 2 μm, the channel length L is 1 μm, and the gate voltage $V_g$ is changed to 1, 2, 3, 4, and 5V.

The transfer characteristics shown in FIG. 7 indicate that measurement results are well simulated from the weak inversion region to the strong inversion region. Also, the results of the output characteristics shown in FIG. 8 indicate that the measured values and calculated values (simulated values) are almost equal. The total number of device parameters adjusted during fitting is only four, i.e., the carrier mobility μ, the flat-band voltage $V_{fb}$, the parameter $g_{c1}$ (peak concentration that gives a defect concentration distribution) pertaining to the defect (localized state) distribution, and the acceptor-type defect concentration distribution slope $E_1$. The four parameters are much fewer than about a few tens of parameters of the conventional model. The known values are used as the channel width W, the channel length L, and a substrate (doping) concentration $N_a$ pertaining to the device structure.

Figure 9B:
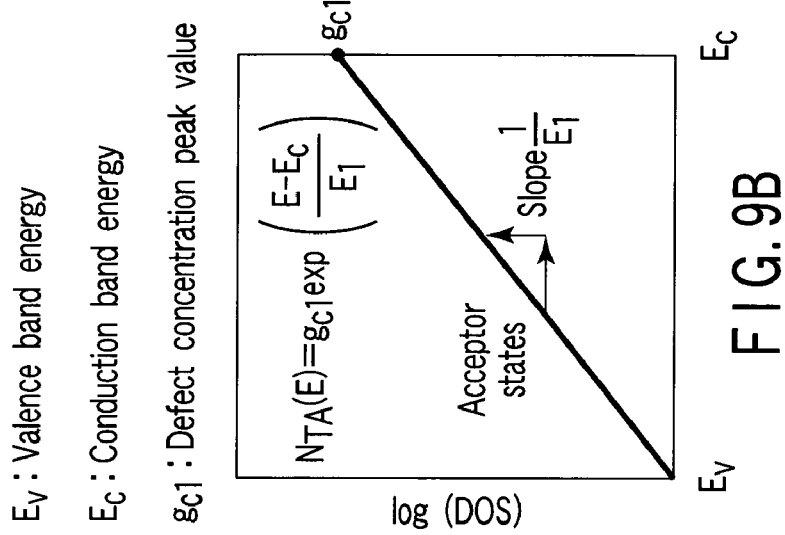
FIG. 9B is a graph showing the defect concentration (trap state density) distribution used to obtain the calculation results shown in FIG. 9A.
Figure 9A:
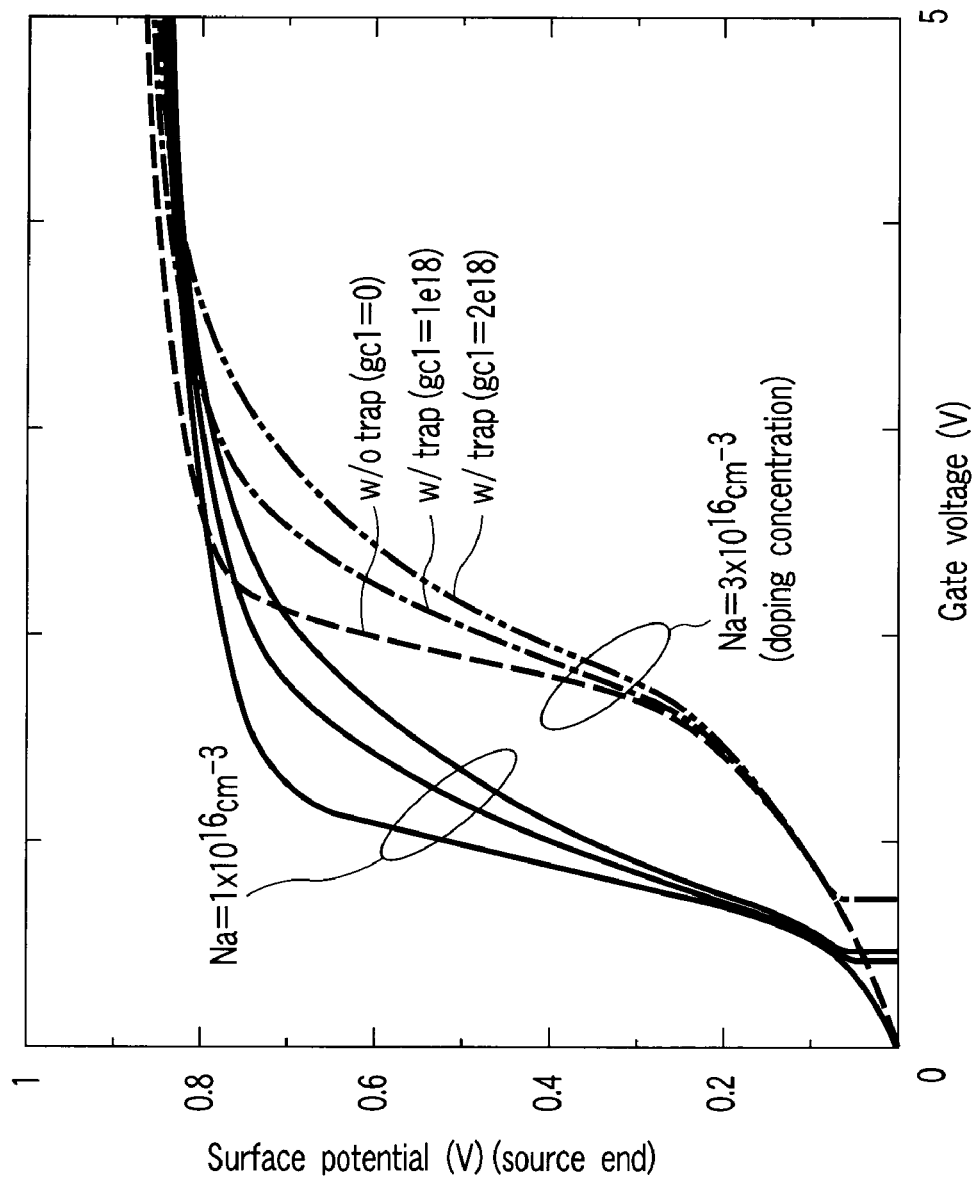
FIG. 9A is a graph showing the relationship between the gate voltage and the surface potential at the source region end when the defect concentration distribution is changed.

FIG. 9A shows the relationship between the gate voltage and the surface potential at the source region end when the defect concentration distribution of an N-channel TFT is changed. FIG. 9B shows the defect concentration distribution used. FIG. 9A shows the results when the substrate concentration is changed to two levels, i.e., $1\times10^{16}$ and $3\times10^{16}$ cm$^{-3}$, and the peak concentration $g_{c1}$ is changed to three levels, i.e., 0, $1\times10^{18}$, and $2\times10^{18}$ cm$^{-3}$. The substrate concentration $N_a$ is $3\times10^{16}$ and $1\times10^{16}$ cm$^{-3}$.

As the value of the peak concentration $g_{c1}$ increases, the leading edge of the surface potential becomes moderate with the increase in gate voltage. Also, the surface potential with respect to the same gate voltage is lower when the substrate concentration $N_a$ is $3\times10^{16}$ cm$^{-3}$ than when it is $1\times10^{16}$ cm$^{-3}$. This corresponds to the fact that the higher the substrate concentration, the higher the voltage at which an inversion layer is formed on the semiconductor surface.

As described above, this simulation model can accurately represent the DC characteristics of a transistor from the weak inversion region to the strong inversion region. In particular, this simulation model can accurately simulate the voltage-current characteristic in the weak inversion region caused by crystal defects unique to a polysilicon TFT. Also, this device model is based on a physical model. Therefore, this device model can be used even when the channel width or channel length has changed, i.e., can be used as a highly versatile designing tool. In addition, the number of parameters that the above device model uses in fitting with the characteristics of a real device is smaller than those of the conventional models. This makes it possible to extract parameters within a short time.

Note that the case using the simplified model that represents two exponential function distributions by one exponential function is explained above. However, if a long calculation time is acceptable, the accuracy can be increased by representing the defect distribution in polysilicon by the sum of two exponential functions.

The distribution of acceptor states $N_{TA}(E)$ among defect states can be represented by $$N_{TA}(E) = g_{c1} \exp\{(E-E_c)/E_1\}$$

On the other hand, the distribution of donor states $N_{TD}(E)$ among defect states can be represented by $$N_{TD}(E) = g_{c2} \exp\{(E_v-E)/E_2\}$$

for $N_{tS0} = \int N_{TA(E)} f_{(E)} dE$, or $$N_{tS0} = \int N_{TD(E)} f_{(E)} dE$$

where $g_{c1}$ is the acceptor-type defect concentration distribution peak value, E is the energy, $E_C$ is the conductor energy, $E_1$ is the acceptor-type defect concentration distribution slope, $g_{c2}$ is the donor-type defect concentration distribution peak value, $E_V$ is the valence band energy, and $E_2$ is the donor-type defect concentration distribution slope.

When the defect distribution in polysilicon is represented by the sum of two exponential functions corresponding to a deep defect distribution and shallow defect distribution as indicated by equation 1.0, the charge amount $q_i(0)$ at the source region end is given by $$q_i(0) = \sqrt{\frac{2q\varepsilon_{Si}N_{sub}}{\beta}} \left[ \exp(-\beta\phi_{S0}) - \exp(-\beta\phi_{b0}) + \beta(\phi_{S0} - \phi_{b0}) + \left(\frac{\beta}{\gamma}\frac{N_{tS10}}{N_{sub}}\right)\{\exp(\gamma\phi_{S0}) - \exp(\gamma\phi_{b0})\} + \left(\frac{N_{tS20}}{N_{sub}}\right)\{\exp(\beta\phi_{S0}) - \exp(\beta\phi_{b0})\} \right]^{\frac{1}{2}}$$

where $N_{tS10}$ is the density of carriers trapped in a first defect distribution at the source region end, and $N_{tS20}$ is the density of carriers trapped in a second defect distribution at the source region end.

On the other hand, the charge amount $q_i(L)$ at the drain region end is given by $$q_i(L) = \sqrt{\frac{2q\varepsilon_{Si}N_{sub}}{\beta}} \left[ \exp(-\beta\phi_{SL}) - \exp(-\beta\phi_{bL}) + \beta(\phi_{SL} - \phi_{bL}) + \left(\frac{\beta}{\gamma}\frac{N_{tD10}}{N_{sub}}\right)\{\exp(\gamma\phi_{SL}) - \exp(\gamma\phi_{bL})\} + \left(\frac{N_{tD20}}{N_{sub}}\right)\{\exp(\beta\phi_{SL}) - \exp(\beta\phi_{bL})\} \right]^{\frac{1}{2}}$$

where $N_{tD10}$ is the density of carriers trapped in a first defect distribution at the drain region end, and $N_{tD20}$ is the density of carriers trapped in a second defect distribution at the drain region end.

It is possible to determine which model to use in accordance with which of the processing time and accuracy has priority over the other.

A simulation apparatus, simulation method, and semiconductor device fabrication method using the above-mentioned device model will be explained in more detail below by way of the first to fifth embodiments.

First Embodiment

Figure 1:
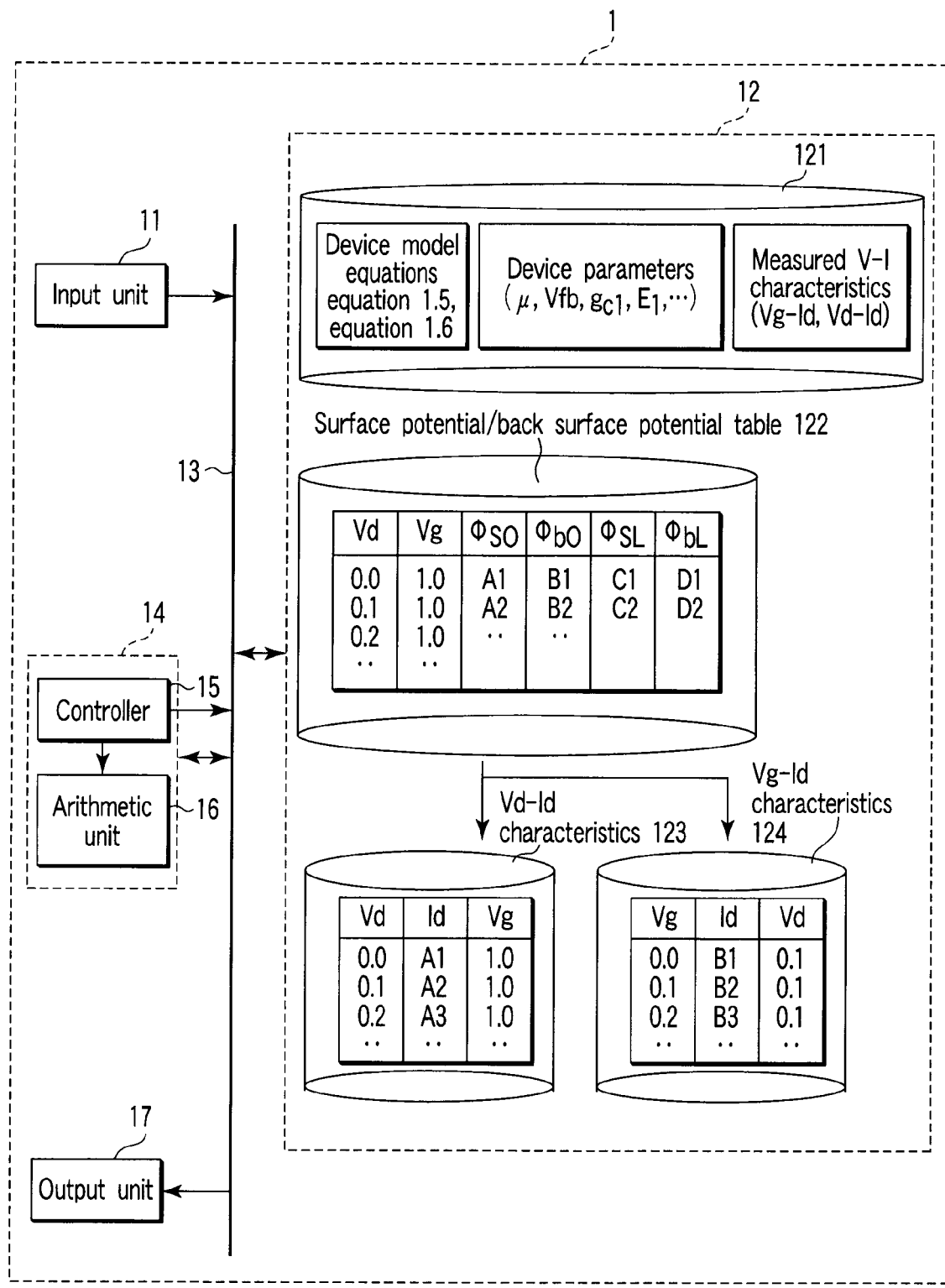
FIG. 1 is a schematic view showing an outline of the arrangement of a simulation apparatus according to the first embodiment of the present invention.

An embodiment of a simulation apparatus that simulates the device characteristics of a TFT or SOI transistor will be explained below with reference to FIG. 1. A simulation apparatus 1 can be configured for simulation only, but can also be implemented by using individual corresponding units of a computer or the like. This embodiment will be explained by taking a personal computer as an example.

The simulation apparatus 1 comprises an input unit 11, storage unit (memory) 12, central processing unit 14, and output unit 17. A signal transmission path such as a bus line 13 connect these units to each other.

The input unit 11 is a keyboard, operation panel, voice input unit, or any kind of various data readers.

The storage unit 12 is a semiconductor memory or hard disk, and stores first to fourth files 121 to 124. The first file 121 records data such as device model equations, e.g., equations 1.5 and 1.6 described above, the initial values of device parameters, and measured V-I characteristics. The second file 122 records data such as the surface potentials and back surface potentials (first, second, third, and fourth potentials $\phi_{S0}$, $\phi_{b0}$, $\phi_{SL}$, and $\phi_{bL}$) of devices such as a TFT and SOI transistor.

The third file 123 records data such as the drain voltage $V_d$-drain current $I_d$ characteristics of devices such as a TFT and SOI transistor. The fourth file 124 records data such as the gate voltage $V_g$-drain current $I_d$ characteristics of devices such as various types of TFTs and SOI transistors.

The central processing unit (CPU) 14 includes a controller 15 and arithmetic unit 16 connected to each other.

The output unit 17 is a monitor, printer, recorder, or the like.

A device parameter extraction method in the simulation apparatus shown in FIG. 1 will be explained below.

Data such as the device model equations, the initial values of device parameters, and the measured device characteristics, e.g., the V-I characteristics are input from the input unit 11 such as a keyboard or any kind of various data readers, and stored in the storage unit 12, e.g., an internal semiconductor memory or hard disk of a personal computer via the bus line 13 under the control of the central processing unit 14.

The central processing unit 14 supplies the input data to the controller 15 and arithmetic unit 16 in the central processing unit 14 via the bus line 13, in order to calculate V-I characteristics.

The controller 15 of the central processing unit 14 controls the arithmetic unit 16 to calculate, e.g., the surface potentials and back surface potentials (first, second, third, and fourth potentials $\phi_{S0}$, $\phi_{b0}$, $\phi_{SL}$, and $\phi_{bL}$) at the source region end and drain region end when the drain voltage and gate voltage are changed. After that, the central processing unit 14 saves the obtained calculation results in a table (surface potential/back surface potential table) of the second file 122.

Then, the central processing unit 14 reads the table recorded in the second file 122, reads device model equations 1.5 and 1.6 from the first file 121, and performs arithmetic operations by the arithmetic unit 16, thereby calculating and outputting the $V_d$-$I_d$ characteristic as the output characteristic and the $V_g$-$I_d$ characteristic as the transfer characteristic. The central processing unit 14 saves the obtained results in tables of the third and fourth files 123 and 124 in association with the input data.

Finally, the central processing unit 14 outputs the obtained V-I characteristics to the output unit 17 such as a monitor or printer. In addition, the central processing unit 14 outputs the extracted device parameters from the output unit 17. If necessary, the central processing unit 14 can also compare simulation results with the measured V-I characteristics on the same display screen, thereby displaying a color graph as shown in FIG. 7 on the monitor.

The simulation apparatus using the device parameter extraction method as described above performs simulation on the basis of a physical model including defect states by using the device model equations obtained by introducing the effect of defect states to a Poisson equation as the basic equation of a circuit model. Accordingly, this simulation apparatus can perform accurate circuit analysis.

In addition, since simulation is performed on the basis of a physical model, device parameters can be readily extracted even when the channel length or the like has changed. As a consequence, an accurate circuit analyzing device model can be obtained within a short time.

Furthermore, measured transistor characteristics of even a transistor using polysilicon having a physical mechanism more complicated than that of single-crystal silicon can be simulated by the four fitting parameters, i.e., the carrier mobility, the flat-band voltage, the peak concentration that gives a defect concentration distribution, and the acceptor-type defect concentration distribution slope. This makes it possible to improve the convenience.

Note that the first embodiment has explained the case that the input unit 11 inputs the measured V-I characteristic as an example. However, a desired value of the V-I characteristic may also be prestored in the storage unit 12 such as a semiconductor memory or hard disk. It is also possible to prestore a plurality of desired values, and allow the central processing unit 14 to select a desired value from these characteristics on the basis of the initial values of device parameters input from the input unit 11.

Second Embodiment

Figure 10:
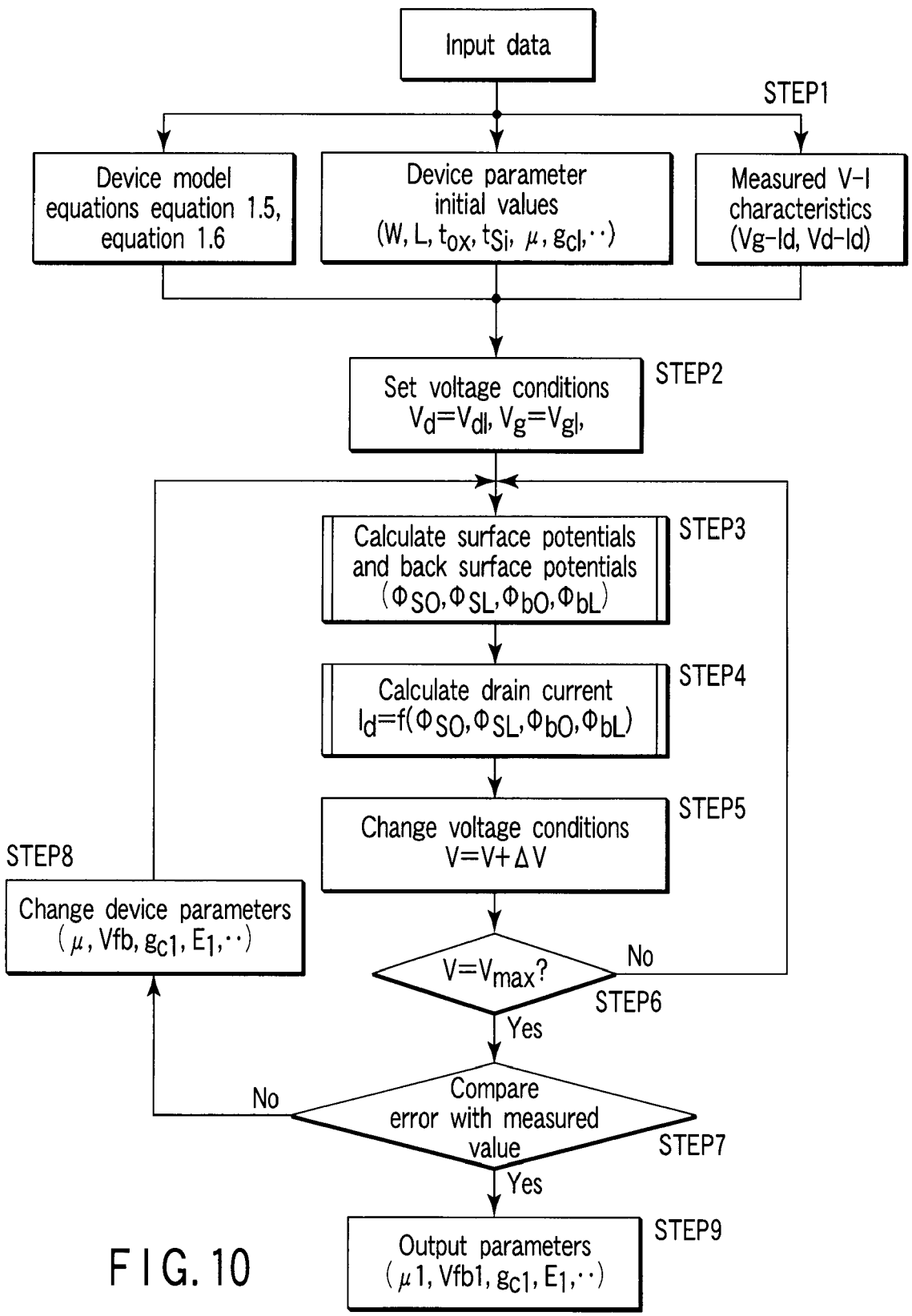
FIG. 10 is a flowchart for explaining a simulation method according to the second embodiment of the present invention.

FIG. 10 is a flowchart for explaining a simulation method according to the second embodiment of the present invention. FIG. 10 shows the procedure by noting extraction of device parameters, and takes the operation of a simulation apparatus configured as shown in FIG. 1 as an example.

First, device model equations 1.5 and 1.6, the initial values of device parameters, and measured V-I characteristics are input as input data from an input unit 11, and stored in a storage unit 12 via a bus line 13 (step 1). Examples of the device parameter initial values are a channel width W, channel length L, oxide film thickness $t_{ox}$, and silicon layer thickness $t_{si}$ determined by the device structure, and a carrier mobility $\mu$ and defect concentration parameter (peak concentration that gives a defect concentration distribution) $g_{c1}$ as fitting parameters of the measured V-I characteristics. Also, the measured V-I characteristics are the $V_g$-$I_d$ characteristic and $V_d$-$I_d$ characteristic. These data are stored as first, second, third, and fourth files in the storage unit 12 such as a semiconductor memory or hard disk.

Then, the input unit 11 inputs voltages $V_d$ and $V_g$ to be applied to the electrodes (source, drain, and gate) of a device (transistor), thereby setting the voltage conditions (step 2). The storage unit 12 stores the voltage conditions as well.

Under the voltage conditions, an arithmetic unit 16 in a central processing unit 14 calculates the surface potentials and back surface potentials (first, second, third, and fourth potentials $\phi_{S0}$, $\phi_{b0}$, $\phi_{SL}$, and $\phi_{bL}$) at the source region end and drain region end (step 3).

The arithmetic unit 16 calculates a drain current $I_{ds}$ in accordance with the device model equations by using the first, second, third, and fourth potentials $\phi_{S0}$, $\phi_{b0}$, $\phi_{SL}$, and $\phi_{bL}$ (step 4).

After that, the voltage conditions to be given to the transistor are changed by $\Delta V$ to set $V=V+\Delta V$, and the drain current $I_{ds}$ is calculated by following the same procedure (step 5).

In this manner, the calculation is repeated until V-I characteristics falling within a target voltage range ($V=V_{max}$) are obtained (step 6).

Subsequently, the V-I characteristics obtained by this simulation are compared with the measured V-I characteristics (step 7).

Whether an error of the simulated value from the measured value falls within a target range is determined by this comparison. If the error is larger than the target error, voltage-current characteristics are recalculated by changing the parameters such as the carrier mobility $\mu$, flat-band voltage $V_{fb}$, defect distribution parameter (defect concentration peak value) $g_{c1}$, and defect concentration distribution slope $E_1$ (step 8).

This procedure is repeated until the error falls within the target range.

If the error falls within the target range, the device parameters used at that time are parameters to be extracted, so the parameters $\mu_1$, $V_{fb1}$, $g_{c1}$, $E_1$, . . . , are output (step 9).

The simulation method using the device parameter extraction method as described above performs simulation on the basis of a physical model including defect states by using the device model equations obtained by introducing the effect of defect states to a Poisson equation as the basic equation of a circuit model. Accordingly, this simulation method can perform accurate circuit analysis.

In addition, since simulation is performed on the basis of a physical model, device parameters can be readily extracted even when the channel length or the like has changed. As a consequence, an accurate circuit analyzing device model can be obtained within a short time.

Furthermore, measured transistor characteristics of even a transistor using polysilicon having a physical mechanism more complicated than that of single-crystal silicon can be simulated by the four fitting parameters, i.e., the carrier mobility, the flat-band voltage, the peak concentration that gives a defect concentration distribution, and the acceptor-type defect concentration distribution slope. This makes it possible to improve the convenience.

Note that the second embodiment has explained the case that the input unit 11 inputs the measured V-I characteristic as an example. However, as in the first embodiment described above, the central processing unit 14 may also make selection from a plurality of V-I characteristics prestored in the storage unit 12, on the basis of the initial values of device parameters input from the input unit 11.

Third Embodiment

Figure 11:
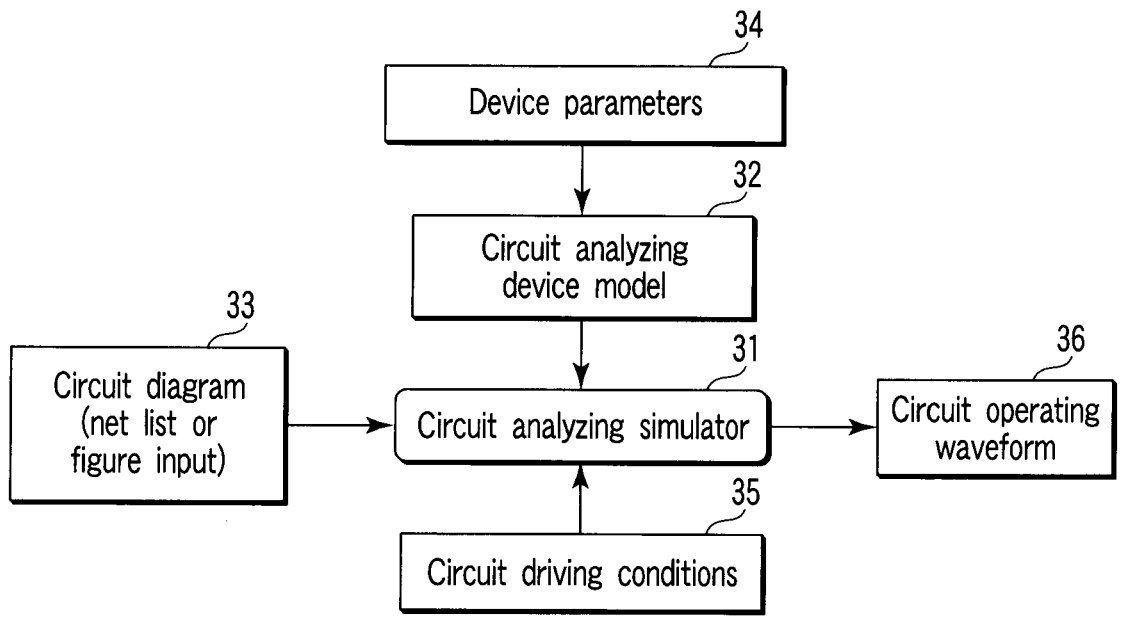
FIG. 11 is a block diagram for explaining the third embodiment of the present invention, which shows an outline of an arrangement when applying a simulation model to a circuit analyzing simulator.

FIG. 11 is a view for explaining the third embodiment of the present invention, and schematically shows an outline of an arrangement when applying the simulation apparatus and simulation method described above to a circuit analyzing simulator.

A circuit analyzing simulator 31 is implemented by individual corresponding units of a computer or the like. The third embodiment uses a personal computer as an example. That is, similar to the apparatus shown in FIG. 1, the circuit analyzing simulator 31 comprises an input unit 11, storage unit (memory) 12, central processing unit 14 (controller 15 and arithmetic unit 16), and output unit 17. A bus line 13 connects these units to each other.

The input unit 11 inputs device parameters, circuit diagrams, and circuit driving conditions, in addition to the device model equations of a transistor and the initial values of the device parameters. The storage unit 12 prestores a program describing instructions for controlling the controller 15, in addition to the device model equations and device parameter initial values input from the input unit 11, and desired V-I characteristics of the transistor.

In accordance with the program stored in the storage unit 12, the controller 15 controls the arithmetic unit 16 to perform arithmetic operations on the basis of the device parameters, circuit diagrams, and circuit driving conditions input from the input unit 11. The output unit 17 outputs the results calculated by the arithmetic unit 16 from a monitor or printer.

The circuit analyzing simulator 31 having the above arrangement receives a circuit diagram 33 in the form of a net list or figure, in addition to a circuit analyzing device model 32. Device parameters 34 extracted as explained in the first and second embodiments are input to the device model 32, and the device model 32 is input to the circuit analyzing simulator 31.

The circuit analyzing simulator 31 also requires data for determining circuit driving conditions 35. After being given these input conditions, the circuit analyzing simulator 31 performs predetermined circuit simulation to obtain a circuit operating waveform 36. The circuit operating waveform 36 is given in the form of a graphic output or time-to-current or time-to-voltage output data in accordance with the purpose.

The arrangement and method as described above perform simulation on the basis of a physical model including defect states by using the device model equations obtained by introducing the effect of defect states to a Poisson equation as the basic equation of a circuit model. Accordingly, accurate circuit analysis can be performed.

In addition, simulation is performed on the basis of the physical model of a transistor. Therefore, device parameters can be readily extracted even when the channel length or the like has changed. As a consequence, an accurate circuit analyzing device model can be obtained within a short time.

Furthermore, measured transistor characteristics of even a transistor in which the source and drain regions are formed in a polysilicon layer having a physical mechanism more complicated than that of single-crystal silicon can be simulated by the four fitting parameters, i.e., the carrier mobility, the flat-band voltage, the peak concentration that gives a defect concentration distribution, and the acceptor-type defect concentration distribution slope. This makes it possible to improve the convenience.

Fourth Embodiment

Figure 12:
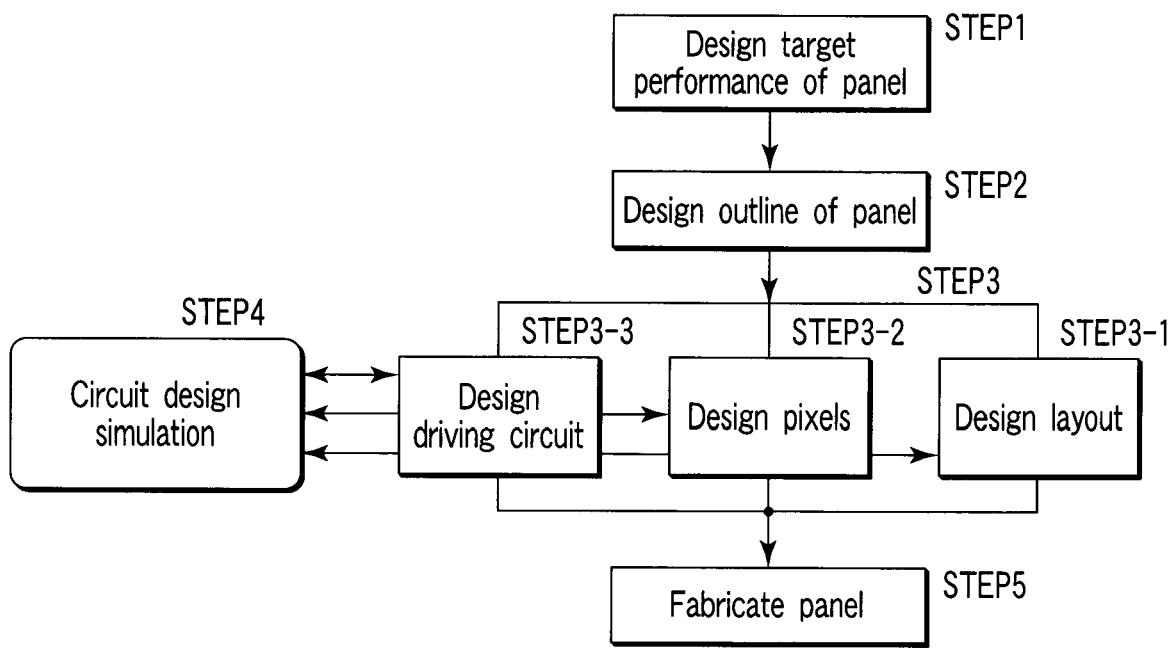
FIG. 12 is a diagram for explaining a semiconductor device fabrication method according to the fourth embodiment of the present invention, which shows the sequence from design to fabrication of an image display panel using circuit design simulation.
Figure 13A:
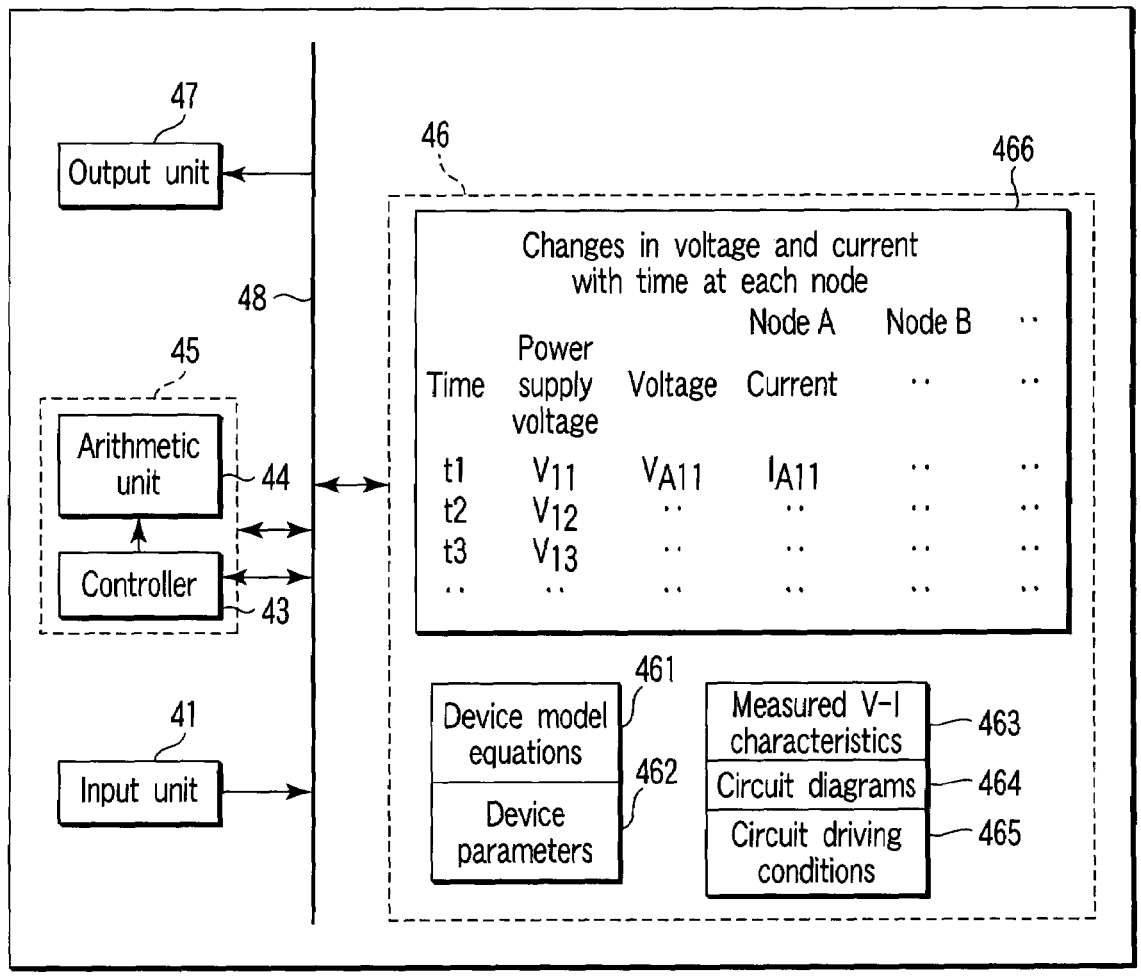
FIG. 13A is a schematic view for explaining a simulation method and simulation apparatus that implement design simulation of a driving circuit shown in FIG. 12.
Figure 13B:
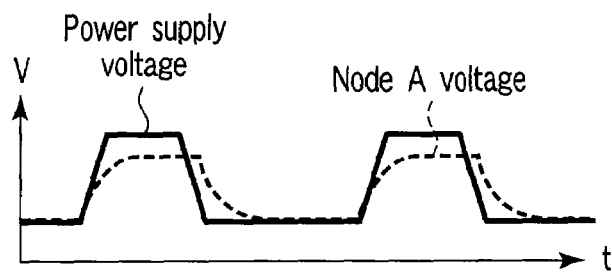
FIG. 13B is an output waveform graph for explaining the simulation method and simulation apparatus that implement design simulation of the driving circuit shown in FIG. 12.

FIGS. 12, 13A, and 13B are views for explaining the fourth embodiment of the present invention. FIG. 12 is a flowchart showing an outline of the procedure when applying the circuit analyzing simulator described above to circuit design. FIG. 13A is a block diagram showing an outline of the arrangement, and FIG. 13B is an output waveform graph. FIG. 12 takes the sequence from design to fabrication of a pixel display panel as an example. In this example, the circuit performance is predicted using the simulation apparatus as shown in FIG. 13A in the stage of designing a driving circuit.

In the system-on-glass or system-on-panel technique that forms a driving circuit on polysilicon or amorphous silicon formed on a glass substrate, defect states inevitably exist in a thin silicon film formed on the glass substrate. Therefore, it is important to predict the circuit performance by using a simulation model taking the defect states into consideration. As the laser crystallization technique advances, it becomes a final object to incorporate, on the thin silicon film on the substrate, not only the driving circuit but also all circuits from signal input to image display including various converters that convert input serial signals into parallel signals and into analog image signals.

First, the target performance of a panel as a semiconductor device to be fabricated is determined (step 1), and an outline of the whole panel for achieving this target performance is designed (step 2). When this design of the outline of the entire panel is complete, the individual elements of the panel are designed (step 3). This element design includes panel layout design (step 3-1), pixel design (step 3-2), and driving circuit design (step 3-3). In the driving circuit design, circuit design simulation is performed by using the device model equations described above (step 4).

Various parameters of the driving circuit are changed on the basis of the prediction results, and the panel is fabricated to obtain the target performance, i.e., the optimum performance (step 5).

The simulation apparatus for designing the driving circuit will be explained in more detail below with reference to FIG. 13A. This simulation apparatus comprises an input unit 41 such as a keyboard, operation panel, voice input unit, or any kind of various data readers, a central processing unit (CPU) 45 including a controller 43 and arithmetic unit 44, a storage unit 46 such as a semiconductor memory or hard disk, and an output unit 47 such as a monitor, printer, or recorder. A signal transmission path such as a bus line 48 connects these units to each other. This simulation apparatus can be implemented by individual corresponding units of a computer or the like, and may also be a personal computer.

The controller 43 and arithmetic unit 44 constitute the central processing unit 45 that performs various processes. The controller 43 controls the operations of the input unit 41, arithmetic unit 44, storage unit 46, output unit 47, and the like. The storage unit 46 stores a program describing instructions for controlling the controller 43, in addition to operation expressions for calculating the surface potentials, threshold voltages, and device characteristics, and operation expressions for a MOSFET. In accordance with this program, the arithmetic unit 44 performs arithmetic operations on the basis of device parameters, circuit diagrams, and circuit driving conditions, thereby simulating the circuit characteristics.

First, input data such as the device model equations, device parameter initial values, circuit diagrams, and driving circuit conditions are input from the input unit 41, and stored as files 461, 462, 463, 464, and 465 in the storage unit 46 under the control of the central processing unit 45. For example, the file 461 corresponds to the device model equations, the file 462 corresponds to the device parameters and their initial values, the file 463 corresponds to the measured V-I characteristics, the file 464 corresponds to the circuit diagrams, and the file 465 corresponds to the circuit driving conditions. These input data are supplied to the controller 43 and arithmetic unit 44 via the bus line 48, and the arithmetic unit 44 calculates the output characteristics of an object circuit. The storage unit 46 stores the output characteristics as a file 466 represented by changes in voltage and current with time at each node (node A, node B . . . . )

Then, as shown in FIG. 13B, the output unit 47 outputs the simulation results, such as the power supply voltage and the changes in voltage and current with time at each node, represented by the file 466 stored in the storage unit 46.

The relationship between the input data and output characteristics obtained by the above calculations is used as data of driving circuit design, thereby fabricating the panel so as to obtain the target performance (optimum performance).

The fabrication method and simulation apparatus as described above can efficiently verify the circuit performance in the stages of trial by circuit design simulation. This makes it possible to optimize the characteristics of a transistor formed in a polysilicon layer on an insulating substrate and the characteristics of a circuit including this transistor.

Note that the above fourth embodiment has explained the case that the input unit 41 inputs the measured V-I characteristic as an example. However, it is of course also possible to allow the central processing unit 45 to make selection from a plurality of V-I characteristics prestored in the storage unit 46, on the basis of the device parameter initial values input from the input unit 41.

Fifth Embodiment

FIGS. 14 to 19 are sectional views for explaining the fifth embodiment of the present invention, which sequentially illustrate the fabrication steps of a semiconductor device. The fifth embodiment takes the fabrication steps of a transistor formed on an SOI substrate as an example.

Figure 14:
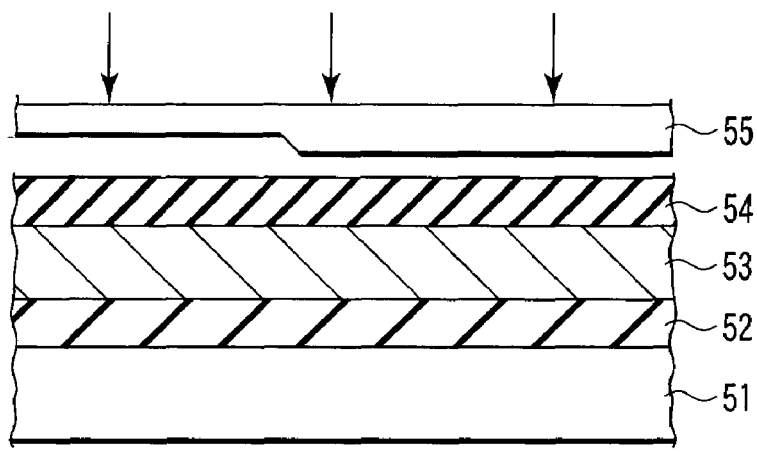
FIG. 14 is a sectional view for explaining a semiconductor device fabrication method according to the fifth embodiment of the present invention, which shows the first fabrication step of a transistor.

First, as shown in FIG. 14, a BOX-SiO$_2$ film 52 is formed on the major surface of a P-type silicon substrate 51. An amorphous silicon layer 53 is formed on the BOX-SiO$_2$ film 52 by, e.g., LP-CVD, and a cap SiO$_2$ film 54 is formed on the amorphous silicon layer 53. A phase-modulation excimer laser annealing (PM-ELA) mask 55 is placed on the semiconductor substrate thus formed, and the semiconductor substrate is annealed with an excimer laser via the PM-ELA mask 55. This annealing changes the amorphous silicon layer 53 into a polysilicon layer 53' close to single-crystal silicon. The thickness of the amorphous silicon layer 53 is determined by verifying the device characteristics and circuit performance on the basis of the above-mentioned circuit design simulation.

Figure 15:
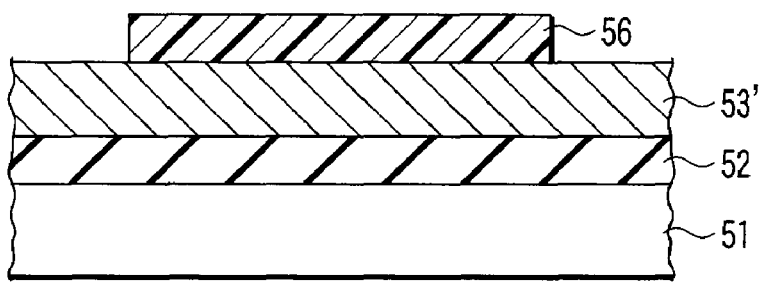
FIG. 15 is a sectional view for explaining the semiconductor device fabrication method according to the fifth embodiment of the present invention, which shows the second fabrication step of the transistor.

Then, as shown in FIG. 15, to form a silicon island region (silicon island) for forming a transistor, the polysilicon layer 53' is coated with a photoresist by spin coating or the like, and a resist mask 56 is formed by exposing and developing the photoresist. The resist mask 56 is used to selectively remove the polysilicon layer 53' by anisotropic etching such as RIE, thereby forming a silicon island 53'. After that, channel ions for controlling the threshold voltage of the transistor are implanted into the silicon island 53'. In this channel ion implantation, the dose of an impurity is determined by verifying the device characteristics and circuit performance on the basis of the circuit design simulation described previously.

Figure 16:
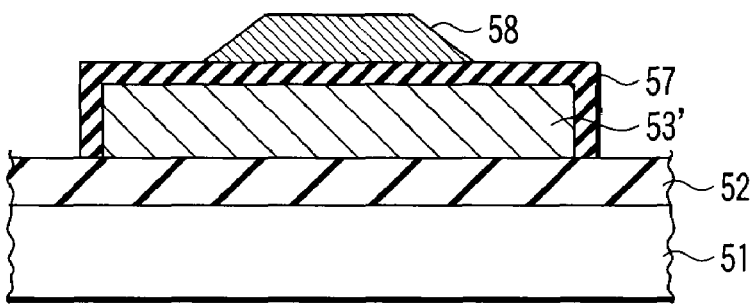
FIG. 16 is a sectional view for explaining the semiconductor device fabrication method according to the fifth embodiment of the present invention, which shows the third fabrication step of the transistor.
Figure 20A:
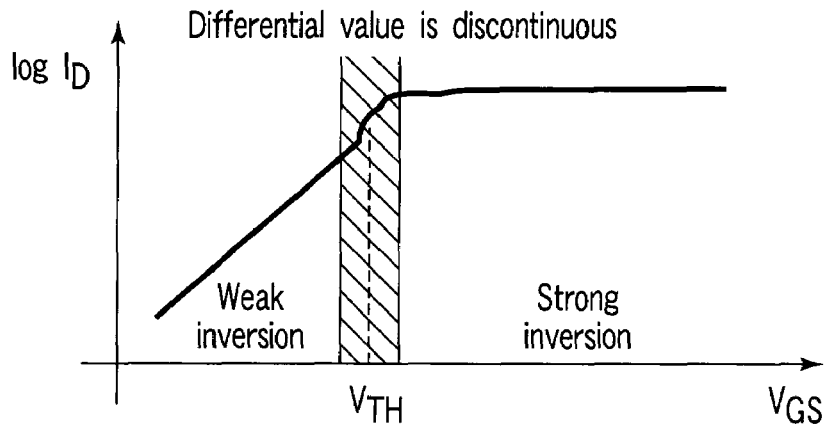
FIG. 20A is a diagram for explaining the problem of the piece-wise model, which shows the differential value of a current in the boundary between a weak inversion region and strong inversion region.
Figure 20B:
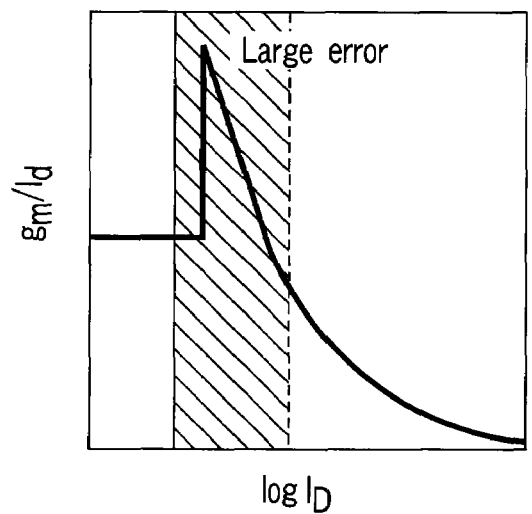
FIG. 20B is a diagram for explaining the problem of the piece-wise model, which shows the occurrence of an error in a level 2 SPICE model.
Figure 20C:
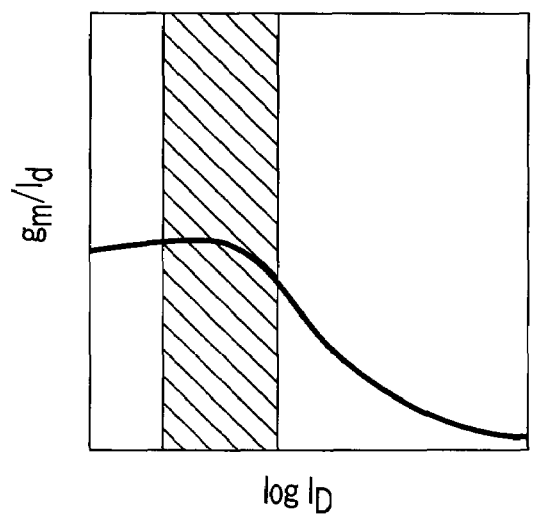
FIG. 20C is a diagram for explaining the problem of the piece-wise model, which shows approximation using a correct curve.

Subsequently, as shown in FIG. 16, a gate insulating film 57 of the transistor is formed by thermally oxidizing the exposed surface of the silicon island 53'. After that, a gate electrode material layer made of a metal or the like is formed on the gate insulating film 57, and patterned to form a gate electrode 58.

As shown in FIG. 17, the gate electrode 58 is used as a mask to ion-implant phosphorus into the silicon island 53', thereby forming source and drain regions 53S and 53D.

Then, as shown in FIG. 18, a second insulating layer 59 is formed on all the surfaces of the gate electrode 58, gate insulating film 57, and BOX-SiO$_2$ film 52. After that, contact holes 60 reaching at least the source and drain regions 53S and 53D are formed by anisotropic etching such as RIE in those portions of the second insulating layer 59 and gate insulating film 57, which correspond to the source and drain regions 53S and 53D.

Subsequently, as shown in FIG. 19, an electrode material layer made of a metal or the like is formed on the second insulating layer 59 and in the contact holes 60, and patterned to form source and drain electrodes 61S and 61D. A passivation film 62 is formed on all the surfaces of the second insulating layer 59, source and drain electrodes 61S and 61D, and BOX-SiO$_2$ film 52.

The semiconductor device fabrication method as described above can form a superior semiconductor device having electrical characteristics based on a physical model, by setting the impurity dose by using the above-mentioned device model equations when implanting channel ions into the silicon island 53' in the step shown in FIG. 15. It is of course also possible, if necessary, to set other various parameters of the semiconductor device by using the device model equations described above.

As described above, the present invention is applicable to a liquid crystal display device or organic EL display device having a driving circuit formed in a pseudo single crystal on a glass substrate. The present invention is also applicable to a so-called system-on-panel in which various signal converters such as a converter that converts input digital signals into image display signals. The present invention can be further applied to a semiconductor integrated circuit device formed on an SOI substrate.

Accordingly, the present invention can provide a simulation apparatus and simulation method capable of performing accurate circuit analysis within a relatively short time on the basis of a physical model including defect states.

The present invention can also provide a simulation apparatus and simulation method capable of simulating the characteristics of a semiconductor device or circuit including a TFT formed in a thin polysilicon film on an insulating substrate or a transistor formed on an SOI substrate, by using a relatively small number of fitting parameters (carrier mobility, flat-band voltage, peak concentration that gives a defect concentration distribution, and defect concentration distribution slope).

Furthermore, the present invention can provide a semiconductor device fabrication method capable of optimizing the characteristics of a transistor formed in a polysilicon layer on an insulating substrate and the characteristics of a circuit including this transistor, by performing circuit design simulation by using the above simulation method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A simulation apparatus which simulates device characteristics of a transistor in which a source region and a drain region are formed apart from each other in a polysilicon layer on an insulating substrate, and a gate electrode is formed on a channel region between the source region and the drain region via a gate insulating film, the apparatus comprising:
    an input unit which inputs a device model equation of the transistor and an initial value of a device parameter;
    a storage unit which stores the device model equation and the initial value of the device parameter input from the input unit, and a desired voltage-current characteristic of the transistor;
    an arithmetic unit which performs an arithmetic operation on the basis of the initial value of the device parameter stored in the storage unit to calculate a first potential $\phi_{S0}$ at a source region end adjacent to a gate electrode end on a surface, which faces the gate electrode, of the polysilicon layer of the transistor, a second potential $\phi_{b0}$ at the source region end on a surface, which faces the insulating substrate, of the polysilicon layer, a third potential $\phi_{SL}$ at a drain region end adjacent to the gate electrode end on the surface, which faces the gate electrode, of the polysilicon layer of the transistor, and a fourth potential $\phi_{bL}$ at the drain region end on the surface, which faces the insulating substrate, of the polysilicon layer, and calculates a drain current $I_{ds}$ by substituting the first potential $\phi_{S0}$, the second potential $\phi_{b0}$, the third potential $\phi_{SL}$, and the fourth potential $\phi_{bL}$ into the device model equation stored in the storage unit;
    a controller which controls the input unit, the storage unit, and the arithmetic unit to compare the desired voltage-current characteristic of the transistor stored in the storage unit with a voltage-current characteristic based on the drain current $I_{ds}$ obtained by the arithmetic operation by the arithmetic unit, and obtain a model parameter by changing the device parameter until a difference becomes not more than an allowable error; and
    an output unit which outputs the model parameter obtained by the arithmetic operation by the arithmetic unit, under the control of the controller,
    wherein the device model equation is represented by $$I_{ds} = \frac{W}{L}\mu\frac{IDD}{\beta}$$

$$IDD = C_{ox}(\beta V'_g + 1)(\phi_{SL} - \phi_{S0}) - \frac{\beta}{2}C_{ox}(\phi_{SL}^2 - \phi_{S0}^2) - \frac{\beta}{2}\{q_i(0) + q_i(L)\}(\phi_{SL} - \phi_{S0}) - \{q_i(0) - q_i(L)\}$$

in which a charge amount $q_i(0)$ at the source region end is obtained by $$q_i(0) = \sqrt{\frac{2q\varepsilon_{Si}N_{sub}}{\beta}}\left[\exp(-\beta\phi_{S0}) - \exp(-\beta\phi_{b0}) + \beta(\phi_{S0} - \phi_{b0}) + \left(\frac{\beta}{\gamma}\frac{N_{tS0}}{N_{sub}}\right)\{\exp(\gamma\phi_{S0}) - \exp(\gamma\phi_{b0})\}\right]^{\frac{1}{2}}$$

and a charge amount $q_i(L)$ at the drain region end is obtained by $$q_i(L) = \sqrt{\frac{2q\varepsilon_{Si}N_{sub}}{\beta}}\left[\exp(-\beta\phi_{SL}) - \exp(-\beta\phi_{bL}) + \beta(\phi_{SL} - \phi_{bL}) + \left(\frac{\beta}{\gamma}\frac{N_{tD0}}{N_{sub}}\right)\{\exp(\gamma\phi_{SL}) - \exp(\gamma\phi_{bL})\}\right]^{\frac{1}{2}}$$

where W is a channel width of the transistor, L is a channel length of the transistor, μ is carrier mobility, IDD is a total surface charge amount, β is a reciprocal of a thermal voltage, $C_{ox}$ is a gate oxide film capacitance, $V_g'$ is a voltage obtained by subtracting a flat-band voltage from a gate-to-source voltage, q is an elementary charge, $\varepsilon_{si}$ a dielectric constant of silicon, $N_{sub}$ is a substrate impurity concentration, $N_{tS0}$ is a density of carriers trapped at the source region end, $N_{tD0}$ is a density of carriers trapped at the drain region end, γ is a coefficient of a substrate biasing effect, and
    a model is formed by including defect states in the polysilicon layer in which the transistor is formed.

2. An apparatus according to claim 1, wherein a distribution of acceptor states $N_{TA}(E)$ of the defect states is represented by $$N_{TA}(E) = g_{c1}\exp\{(E-E_c)/E_1\}$$

and a distribution of donor states $N_{TD}(E)$ of the defect states is represented by $$N_{TD}(E) = g_{c2}\exp\{(E_v-E)/E_2\}$$

for $N_{tS0} = \int N_{TA(E)}f_{(E)}dE$, or $N_{tS0} = \int N_{TD(E)}f_{(E)}dE$ where $g_{c1}$ is an acceptor-type defect concentration distribution peak value, E is energy, $E_C$ is conductor energy, $E_1$ is an acceptor-type defect concentration distribution slope, $g_{c2}$ is a donor-type defect concentration distribution peak value, $E_V$ is valence band energy, $E_2$ is a donor-type defect concentration distribution slope, and $f_{(E)}$ is a Fermi distribution function.

3. An apparatus according to claim 1, wherein the desired voltage-current characteristic is obtained by inputting a measured voltage-current characteristic of a prototype transistor from the input unit, and storing the input measured voltage-current characteristic in the storage unit.

4. An apparatus according to claim 1, wherein the desired voltage-current characteristic is selected by the controller from a plurality of voltage-current characteristics prestored in the storage unit, on the basis of the initial value of the device parameter input from the input unit.

5. An apparatus according to claim 1, wherein
    the storage unit further stores a program describing an instruction for controlling the controller, and a device parameter, a circuit diagram, and a circuit driving condition input from the input unit, and
    the controller controls, in accordance with the program, the arithmetic unit to perform an arithmetic operation on the basis of the device parameter, the circuit diagram, and the circuit driving condition, thereby simulating circuit characteristics.

6. A simulation method of simulating device characteristics of a transistor in which a source region and a drain region are formed apart from each other in a polysilicon layer on an insulating substrate, and a gate electrode is formed on a channel region between the source region and the drain region via a gate insulating film, the method comprising:

inputting a device model equation of the transistor from an input unit and storing the input device model equation in a storage unit;

inputting an initial value of a device parameter of the transistor from the input unit and storing the input initial value of the device parameter in the storage unit;

inputting a desired voltage-current characteristic of the transistor from the input unit and storing the input desired voltage-current characteristic in the storage unit;

performing an arithmetic operation by an arithmetic unit on the basis of the initial value of the device parameter stored in the storage unit, thereby calculating a first potential $\phi_{S0}$ at a source region end adjacent to a gate electrode end on a surface, which faces the gate electrode, of the polysilicon layer of the transistor, a second potential $\phi_{b0}$ at the source region end on a surface, which faces the insulating substrate, of the polysilicon layer, a third potential $\phi_{SL}$ at a drain region end adjacent to the gate electrode end on the surface, which faces the gate electrode, of the polysilicon layer of the transistor, and a fourth potential $\phi_{bL}$ at the drain region end on the surface, which faces the insulating substrate, of the polysilicon layer;

performing an arithmetic operation by the arithmetic unit by substituting the first potential $\phi_{S0}$, the second potential $\phi_{b0}$, the third potential $\phi_{SL}$, and the fourth potential $\phi_{bL}$ into the device model equation stored in the storage unit, thereby calculating a drain current $I_{ds}$;

comparing the desired voltage-current characteristic of the transistor with a voltage-current characteristic based on the drain current $I_{ds}$ obtained by the arithmetic operation; and controlling the input unit, the storage unit, and the arithmetic unit by a controller, and performing an arithmetic operation by the arithmetic unit by changing the device parameter until a result of the comparison between the voltage-current characteristics becomes not more than an allowable error, thereby obtaining a model parameter, wherein the device model equation is represented by $$I_{ds} = \frac{W}{L}\mu\frac{IDD}{\beta}$$

$$IDD = C_{ox}(\beta V_g' + 1)(\phi_{SL} - \phi_{S0}) - \frac{\beta}{2}C_{ox}(\phi_{SL}^2 - \phi_{S0}^2) - \frac{\beta}{2}\{q_i(0) + q_i(L)\}(\phi_{SL} - \phi_{S0}) - \{q_i(0) - q_i(L)\}$$

in which a charge amount $q_i(0)$ at the source region end is obtained by $$q_i(0) = \sqrt{\frac{2q\varepsilon_{Si}N_{sub}}{\beta}}\left[\exp(-\beta\phi_{S0}) - \exp(-\beta\phi_{b0}) + \beta(\phi_{S0} - \phi_{b0}) + \left(\frac{\beta}{\gamma}\frac{N_{tS0}}{N_{sub}}\right)\{\exp(\gamma\phi_{S0}) - \exp(\gamma\phi_{b0})\}\right]^{\frac{1}{2}}$$

and a charge amount $q_i(L)$ at the drain region end is obtained by $$q_i(L) = \sqrt{\frac{2q\varepsilon_{Si}N_{sub}}{\beta}}\left[\exp(-\beta\phi_{SL}) - \exp(-\beta\phi_{bL}) + \beta(\phi_{SL} - \phi_{bL}) + \left(\frac{\beta}{\gamma}\frac{N_{tD0}}{N_{sub}}\right)\{\exp(\gamma\phi_{SL}) - \exp(\gamma\phi_{bL})\}\right]^{\frac{1}{2}}$$

where W is a channel width of the transistor, L is a channel length of the transistor, µ is carrier mobility, IDD is a total surface charge amount, $\beta$ is a reciprocal of a thermal voltage, $C_{ox}$ is a gate oxide film capacitance, $V_g'$ is a voltage obtained by subtracting a flat-band voltage from a gate-to-source voltage, q is an elementary charge, $\varepsilon_{si}$ is a dielectric constant of silicon, $N_{sub}$ is a substrate impurity concentration, $N_{tS0}$ is a density of carriers trapped at the source region end, $N_{tD0}$ is a density of carriers trapped at the drain region end, and $\gamma$ is a coefficient of a substrate biasing effect, and a model is formed by including defect states in the polysilicon layer in which the transistor is formed.

7. A method according to claim 6, wherein a distribution of acceptor states $N_{TA}(E)$ of the defect states is represented by $$N_{TA}(E) = g_{c1}\exp\{(E-E_c)/E_1\}$$

and a distribution of donor states $N_{TD}(E)$ of the defect states is represented by $$N_{TD}(E) = g_{c2}\exp\{(E_v-E)/E_2\}$$

for $N_{tS0} = \int N_{TA(E)} \cdot f_{(E)} dE$, or $N_{tS0} = \int N_{TD(E)} \cdot f_{(E)} dE$ where $g_{c1}$ is an acceptor-type defect concentration distribution peak value, E is energy, $E_C$ is conductor energy, $E_1$ is an acceptor-type defect concentration distribution slope, $g_{c2}$ is a donor-type defect concentration distribution peak value, $E_V$ is valence band energy, $E_2$ is a donor-type defect concentration distribution slope, and $f_{(E)}$ is a Fermi distribution function.

8. A method according to claim 6, wherein the desired voltage-current characteristic is obtained by inputting a measured voltage-current characteristic of a prototype transistor from the input unit, and storing the input measured voltage-current characteristic in the storage unit.

9. A method according to claim 6, wherein the desired voltage-current characteristic is selected by the controller from a plurality of voltage-current characteristics prestored in the storage unit, on the basis of the initial value of the device parameter input from the input unit.

10. A method according to claim 6, which further comprises:

storing, in the storage unit, a program describing a instruction for controlling the controller; and inputting a device parameter, a circuit diagram, and a circuit driving condition from the input unit, and storing the input device parameter, circuit diagram, and circuit driving condition in the storage unit, and in which the controller controls, in accordance with the program stored in the storage unit, the arithmetic unit to perform an arithmetic operation on the basis of the model parameter calculated by the arithmetic unit, the circuit diagram, and the circuit driving condition, thereby simulating circuit characteristics.

11. A semiconductor device fabrication method comprising:

determining target performance of a semiconductor device to be fabricated;

designing an outline for implementing the target performance;

designing individual elements;

performing circuit design simulation by using a device model equation; and changing various parameters of a circuit on the basis of a prediction result obtained by the circuit design simulation, thereby fabricating the semiconductor device so as to obtain the target performance, wherein the semiconductor device to be fabricated comprises a transistor in which a source region and a drain region are formed apart from each other in a polysilicon layer on an insulating substrate, and a gate electrode is formed on a channel region between the source region and the drain region via a gate insulating film, wherein performing the circuit design simulation by using the device model equation comprises:

storing, in a storage unit, a program describing an instruction for controlling a controller;

inputting the device model equation of the transistor from an input unit and storing the input device model equation in the storage unit;

inputting an initial value of a device parameter of the transistor from the input unit and storing the input initial value of the device parameter in the storage unit;

inputting a desired voltage-current characteristic of the transistor from the input unit and storing the input desired voltage-current characteristic in the storage unit;

inputting a device parameter, a circuit diagram, and a circuit driving condition from the input unit, and storing the input device parameter, circuit diagram, and circuit driving condition in the storage unit;

performing an arithmetic operation by an arithmetic unit on the basis of the initial value of the device parameter stored in the storage unit, thereby calculating a first potential $\phi_{S0}$ at a source region end adjacent to a gate electrode end on a surface, which faces the gate electrode, of the polysilicon layer of the transistor, a second potential $\phi_{b0}$ at the source region end on a surface, which faces the insulating substrate, of the polysilicon layer, a third potential $\phi_{SL}$ at a drain region end adjacent to the gate electrode end on the surface, which faces the gate electrode, of the polysilicon layer of the transistor, and a fourth potential $\phi_{bL}$ at the drain region end on the surface, which faces the insulating substrate, of the polysilicon layer;

performing an arithmetic operation by the arithmetic unit by substituting the calculated first potential $\phi_{S0}$, second potential $\phi_{b0}$, third potential $\phi_{SL}$, and fourth potential $\phi_{bL}$ into the device model equation stored in the storage unit, thereby calculating a drain current $I_{ds}$;

comparing the desired voltage-current characteristic of the transistor with a voltage-current characteristic based on the drain current obtained by the arithmetic operation;

controlling the input unit, the storage unit, and the arithmetic unit by a controller, and performing an arithmetic operation by the arithmetic unit by changing the device parameter until a result of the comparison between the voltage-current characteristics becomes not more than an allowable error, thereby obtaining a model parameter; and in accordance with the program stored in the storage unit, performing an arithmetic operation by the arithmetic unit on the basis of the model parameter, the circuit diagram, and the circuit driving condition, under the control of the controller, thereby simulating circuit characteristics, wherein the device model equation is represented by $$I_{ds} = \frac{W}{L}\mu\frac{IDD}{\beta}$$

$$IDD = C_{ox}(\beta V'_g + 1)(\phi_{SL} - \phi_{S0}) - \frac{\beta}{2}C_{ox}(\phi_{SL}^2 - \phi_{S0}^2) -$$

$$\frac{\beta}{2}\{q_i(0) + q_i(L)\}(\phi_{SL} - \phi_{S0}) - \{q_i(0) - q_i(L)\}$$

in which a charge amount $q_i(0)$ at the source region end is obtained by $$q_i(0) = \sqrt{\frac{2q\varepsilon_{Si}N_{sub}}{\beta}}\left[\exp(-\beta\phi_{S0}) - \exp(-\beta\phi_{b0}) + \beta(\phi_{S0} - \phi_{b0}) + \left(\frac{\beta}{\gamma}\frac{N_{tS0}}{N_{sub}}\right)\{\exp(\gamma\phi_{S0}) - \exp(\gamma\phi_{b0})\}\right]^{\frac{1}{2}}$$

and a charge amount $q_i(L)$ at the drain region end is obtained by $$q_i(L) = \sqrt{\frac{2q\varepsilon_{Si}N_{sub}}{\beta}}\left[\exp(-\beta\phi_{SL}) - \exp(-\beta\phi_{bL}) + \beta(\phi_{SL} - \phi_{bL}) + \left(\frac{\beta}{\gamma}\frac{N_{tD0}}{N_{sub}}\right)\{\exp(\gamma\phi_{SL}) - \exp(\gamma\phi_{bL})\}\right]^{\frac{1}{2}}$$

where W is a channel width of the transistor, L is a channel length of the transistor, $\mu$ is carrier mobility, IDD is a total surface charge amount, $\beta$ is a reciprocal of a thermal voltage, $C_{ox}$ is a gate oxide film capacitance, $V_g'$ is a voltage obtained by subtracting a flat-band voltage from a gate-to-source voltage, q is an elementary charge, $\varepsilon_{si}$ is a dielectric constant of silicon, $N_{sub}$ is a substrate impurity concentration, $N_{tS0}$ is a density of carriers trapped at the source region end, $N_{tD0}$ is a density of carriers trapped at the drain region end, and $\gamma$ is a coefficient of a substrate biasing effect, and a model is formed by including defect states in the polysilicon layer in which the transistor is formed.

12. A method according to claim 11, wherein a distribution of acceptor states $N_{TA}(E)$ of the defect states is represented by $$N_{TA}(E) = g_{c1}\exp\{(E-E_c)/E_1\}$$

and a distribution of donor states $N_{TD}(E)$ of the defect states is represented by $$N_{TD}(E) = g_{c2}\exp\{(E_v-E)/E_2\}$$

for $N_{tS0} = \int N_{TA(E)}f_{(E)}dE$, or $N_{tS0} = \int N_{TD(E)}f_{(E)}dE$ where $g_{c1}$ is an acceptor-type defect concentration distribution peak value, E is energy, $E_C$ is conductor energy, $E_1$ is an acceptor-type defect concentration distribution slope, $g_{c2}$ is a donor-type defect concentration distribution peak value, $E_V$ is valence band energy, $E_2$ is a donor-type defect concentration distribution slope, and $f_{(E)}$ is a Fermi distribution function.

13. A method according to claim 11, wherein the desired voltage-current characteristic is obtained by inputting a measured voltage-current characteristic of a prototype transistor from the input unit, and storing the input measured voltage-current characteristic in the storage unit.

14. A method according to claim 11, wherein the desired voltage-current characteristic is selected by the controller from a plurality of voltage-current characteristics prestored in the storage unit, on the basis of the initial value of the device parameter input from the input unit.

15. A method according to claim 11, which further comprises:

storing, in the storage unit, a program describing a instruction for controlling the controller; and inputting a device parameter, a circuit diagram, and a circuit driving condition from the input unit, and storing the input device parameter, circuit diagram, and circuit driving condition in the storage unit, and in which the controller controls, in accordance with the program stored in the storage unit, the arithmetic unit to perform an arithmetic operation on the basis of the model parameter calculated by the arithmetic unit, the circuit diagram, and the circuit driving condition, thereby simulating circuit characteristics.

* * * * *